US012563728B2

(12) United States Patent
Teo et al.

(10) Patent No.: US 12,563,728 B2
(45) Date of Patent: Feb. 24, 2026

(54) MICROELECTRONIC DEVICES INCLUDING IMPLANT REGIONS ADJACENT TO DIELECTRIC SLOT STRUCTURES, AND RELATED MEMORY DEVICES, ELECTRONIC SYSTEMS, AND METHODS

(71) Applicant: Micron Technology, Inc., Boise, ID (US)

(72) Inventors: Zhiqiang Teo, Singapore (SG); Chun Wei Ee, Singapore (SG); Anson Lin, Singapore (SG); Yuwei Ma, Singapore (SG); Martin J. Barclay, Middleton, ID (US); John D. Hopkins, Meridian, ID (US); Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 712 days.

(21) Appl. No.: 17/805,167

(22) Filed: Jun. 2, 2022

(65) Prior Publication Data

US 2023/0397418 A1 Dec. 7, 2023

(51) Int. Cl.
*H10B 43/27* (2023.01)

(52) U.S. Cl.
CPC ................................... *H10B 43/27* (2023.02)

(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS 9,741,737 B1     8/2017  Huang et al.
2002/0096703 A1 *  7/2002  Vora ....................... H10B 41/27
                                                           257/315
(Continued)

OTHER PUBLICATIONS

Hopkins et al., Integrated Assemblies, and Methods of Forming Integrated Assemblies, Filed Dec. 18, 2020, U.S. Appl. No. 17/126,777, 66 pages.

(Continued)

*Primary Examiner* — William B Partridge
*Assistant Examiner* — Gustavo G Ramallo
(74) *Attorney, Agent, or Firm* — TraskBritt

(57) ABSTRACT

A microelectronic device comprises lateral contact structures overlying a source structure and comprising conductive material, a cap material overlying the lateral contact structures and comprising implant regions therein, a stack structure overlying the cap material and comprising a vertically alternating sequence of insulative structures and conductive structures arranged in tiers, and pillars vertically extending through the stack structure and into the source structure. The pillars individually comprise semiconductive channel material in physical contact with the lateral contact structures. The microelectronic device comprises filled slot structures vertically extending at least through the stack structure and the cap material. The filled slot structures are positioned within horizontal areas of the implant regions of the cap material. Related memory devices, electronic systems, and methods of forming the microelectronic devices are also described.

15 Claims, 21 Drawing Sheets

(58) Field of Classification Search

CPC ........ H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS

| | | | | |
|---|---|---|---|---|
| 2014/0264548 | A1* | 9/2014 | Lee | H10B 41/20 |
| | | | | 257/324 |
| 2017/0256551 | A1* | 9/2017 | Lee | H10B 41/40 |
| 2018/0122904 | A1* | 5/2018 | Matsumoto | H10B 43/10 |
| 2018/0122906 | A1 | 5/2018 | Yu et al. | |
| 2018/0226427 | A1* | 8/2018 | Huang | H10B 43/35 |
| 2020/0403005 | A1* | 12/2020 | Sakurai | H01L 21/31144 |
| 2021/0358938 | A1 | 11/2021 | Hopkins | |
| 2021/0358939 | A1 | 11/2021 | Hopkins et al. | |
| 2021/0375903 | A1 | 12/2021 | Hopkins | |
| 2021/0376083 | A1 | 12/2021 | Greenlee et al. | |
| 2021/0384208 | A1 | 12/2021 | Hopkins et al. | |
| 2021/0384216 | A1 | 12/2021 | Greenlee et al. | |

OTHER PUBLICATIONS

Hopkins et al., Methods of Forming Microelectronic Devices, and Related Microelectronic Devices, Memory Devices, and Electronic Systems, Filed Sep. 4, 2020, U.S. Appl. No. 17/012,741, 52 pages.

Hopkins et al., Microelectronic Devices Including Cap Structures, and Related Electronic Systems and Methods, Filed Dec. 27, 2021, U.S. Appl. No. 63/266,027, 71 pages.

Howder et al., Microelectronic Devices Including Filled Slits and Memory Cell Pillars, and Related Memory Devices, Electronic Systems, and Methods, Filed Apr. 16, 2021, U.S. Appl. No. 17/233,158, 46 pages.

Lindemann et al., Electronic Devices Comprising a Dielectric Material, and Related Systems and Methods, Filed Jan. 26, 2021, U.S. Appl. No. 17/158,918, 55 pages.

Liu et al., Microelectronic Devices with Vertically Recessed Channel Structures and Discrete, Spaced Inter-Slit Structures, and Related Methods and Systems, Filed Jan. 26, 2021, U.S. Appl. No. 17/158,888, 92 pages.

* cited by examiner

MICROELECTRONIC DEVICES INCLUDING IMPLANT REGIONS ADJACENT TO DIELECTRIC SLOT STRUCTURES, AND RELATED MEMORY DEVICES, ELECTRONIC SYSTEMS, AND METHODS

TECHNICAL FIELD

The disclosure, in various embodiments, relates generally to the field of microelectronic device design and fabrication. More specifically, the disclosure relates to microelectronic devices including implant regions, and related memory devices, electronic systems, and methods of forming microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes memory strings vertically extending through one or more stack structures individually including tiers of conductive structures and insulative structures. Each memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the stack structure of the memory device and conductive routing structures so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the stack structure of the memory device. Such staircase structures include individual "steps" defining contact regions of the conductive structures, upon which conductive contact structures can be positioned to provide electrical access to the conductive structures.

In conventional memory devices, cell pillar structures employed to form the memory strings include semiconductive channel materials, and electrical communication between the memory strings and various components of the memory devices is achieved by way a laterally oriented conductive structure in contact with the semiconductive channel materials of the cell pillar structures. However, etching the semiconductive channel materials may cause processing challenges, such as over-etching. Such processing challenges may result in undesirable deformations (e.g., tier bending, tier warping, tier bowing) and/or undesirable damage (e.g., tier cracking, tier collapse) proximate the cell pillar structures and the staircase structures of the stack structures.

DETAILED DESCRIPTION

Figure 1A:
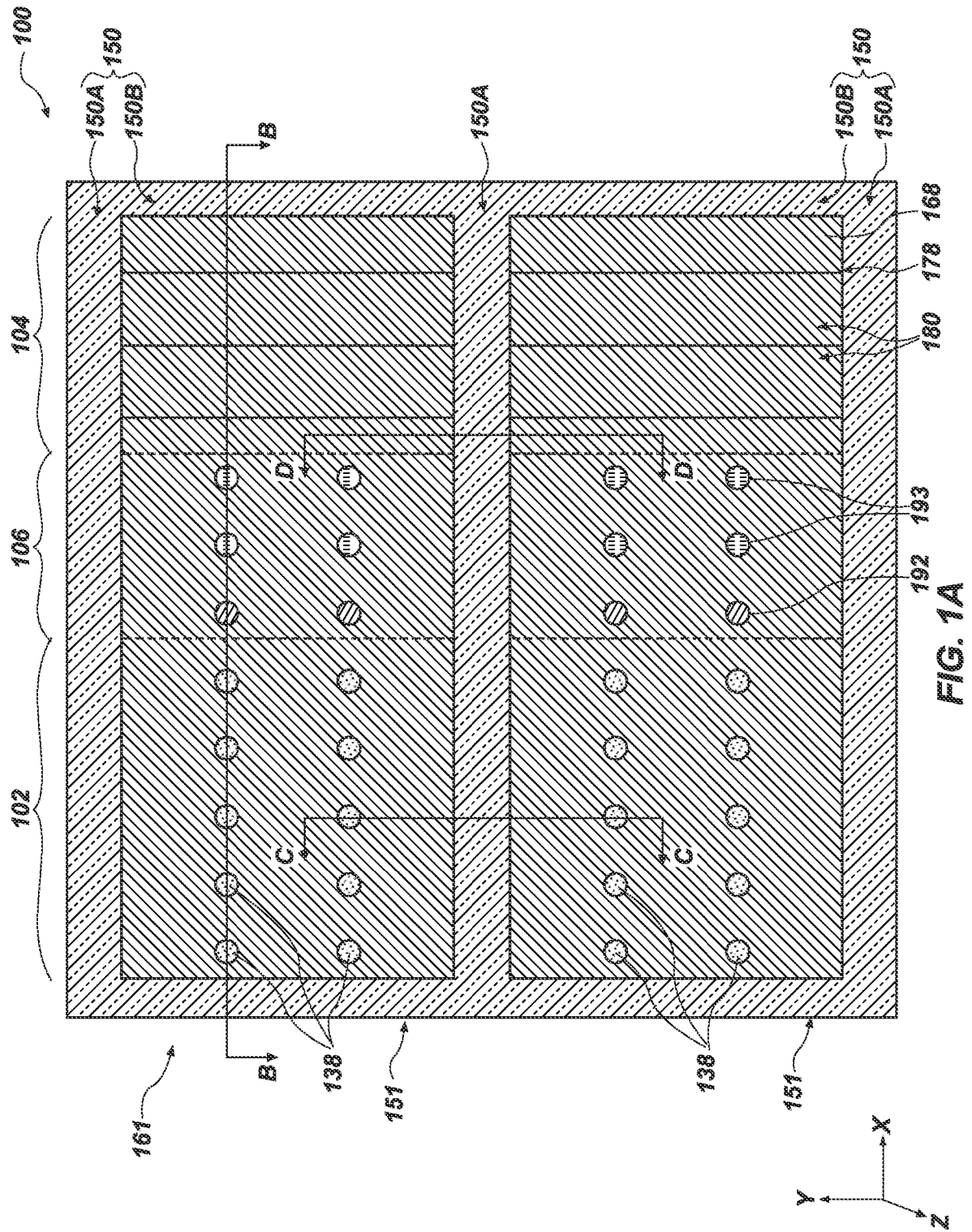
FIGS. 1A through 4B are simplified, partial top-down views (FIGS. 1A, 4A, and 4B) and simplified, partial cross-sectional views (FIGS. 1B through 3C) illustrating different processing stages of a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the claims. The drawings are not necessarily to scale. Additionally, elements common between figures may retain the same numerical designation.

As used herein, a "memory device" means and includes a microelectronic device exhibiting memory functionality, but not necessary limited to memory functionality. Stated another way, and by way of non-limiting example only, the term "memory device" includes not only conventional memory (e.g., conventional non-volatile memory, such as conventional NAND memory; conventional volatile memory, such as conventional dynamic random access memory (DRAM)), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the term "intersection" means and includes a location at which two or more features (e.g., regions, structures, materials, trenches, devices) or, alternatively, two or more portions of a single feature meet. For example, an intersection between a first feature extending in a first direction (e.g., an X-direction) and a second feature extending in a second direction (e.g., a Y-direction) different than the first direction may be the location at which the first feature and the second feature meet.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one of the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including conductive material.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, "semiconductor material" or "semiconductive material" refers to a material having an electrical conductivity between those of insulative materials and conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_XGa_{1-X}As$), and quaternary compound semiconductor materials (e.g., $Ga_XIn_{1-X}As_YP_{1-Y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, the term "sacrificial," when used in reference to a material or structure, means and includes a material or structure that is formed during a fabrication process but which is removed (e.g., substantially removed) prior to completion of the fabrication process.

As used herein, the term "selectively etchable" means and includes a material that exhibits a greater etch rate responsive to exposure to a given etch chemistry relative to another material exposed to the same etch chemistry. For example, the material may exhibit an etch rate that is at least about three times (3×) greater than the etch rate of another material, such as about five times (5×) greater than the etch rate of another material, such as an etch rate of about ten times (10×) greater, about twenty times (20×) greater, or about forty times (40×) greater than the etch rate of the another material. Etch chemistries and etch conditions for selectively etching a desired material may be selected by a person of ordinary skill in the art.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

Figure 1B:
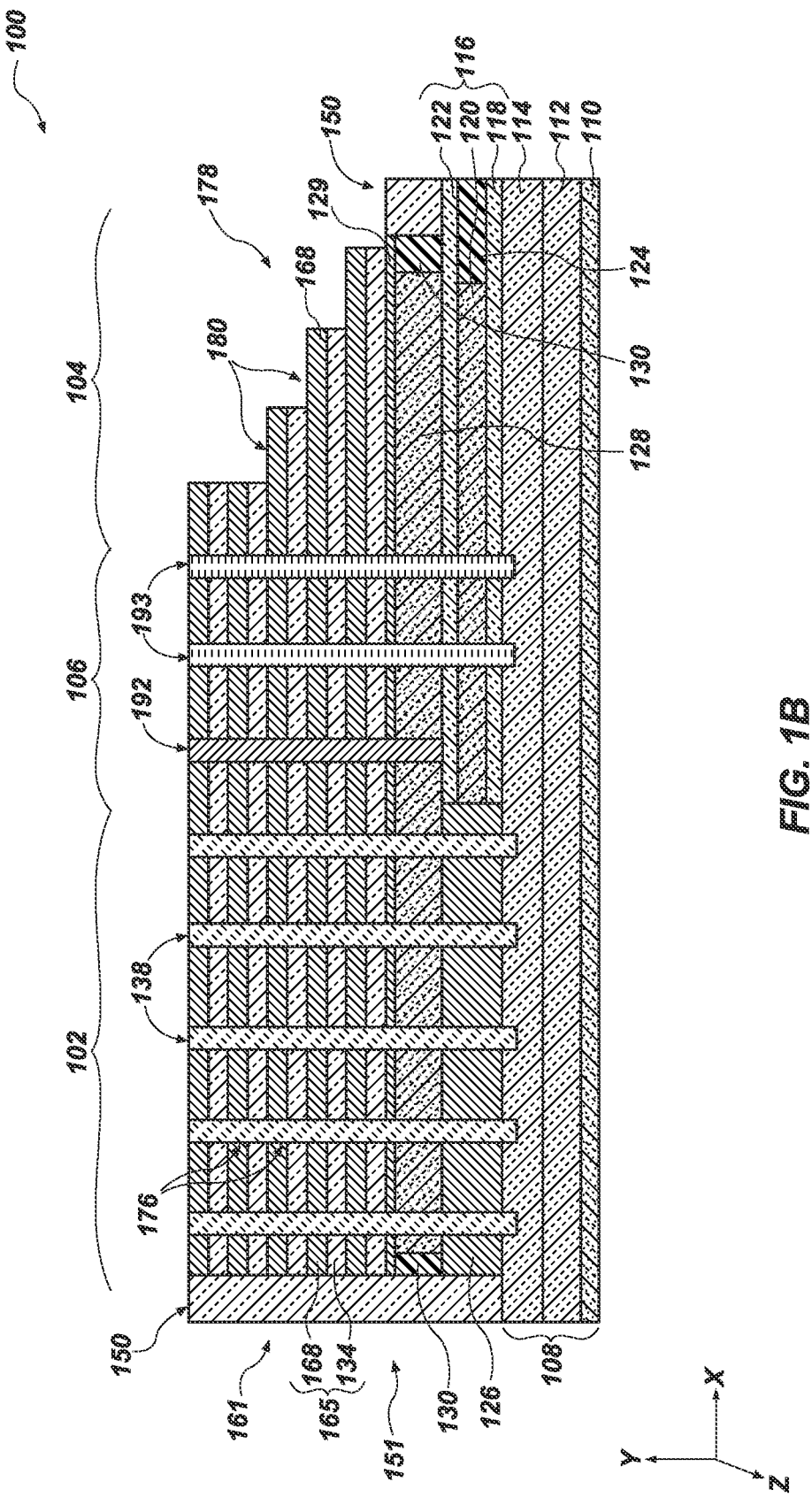
Figure 1C:
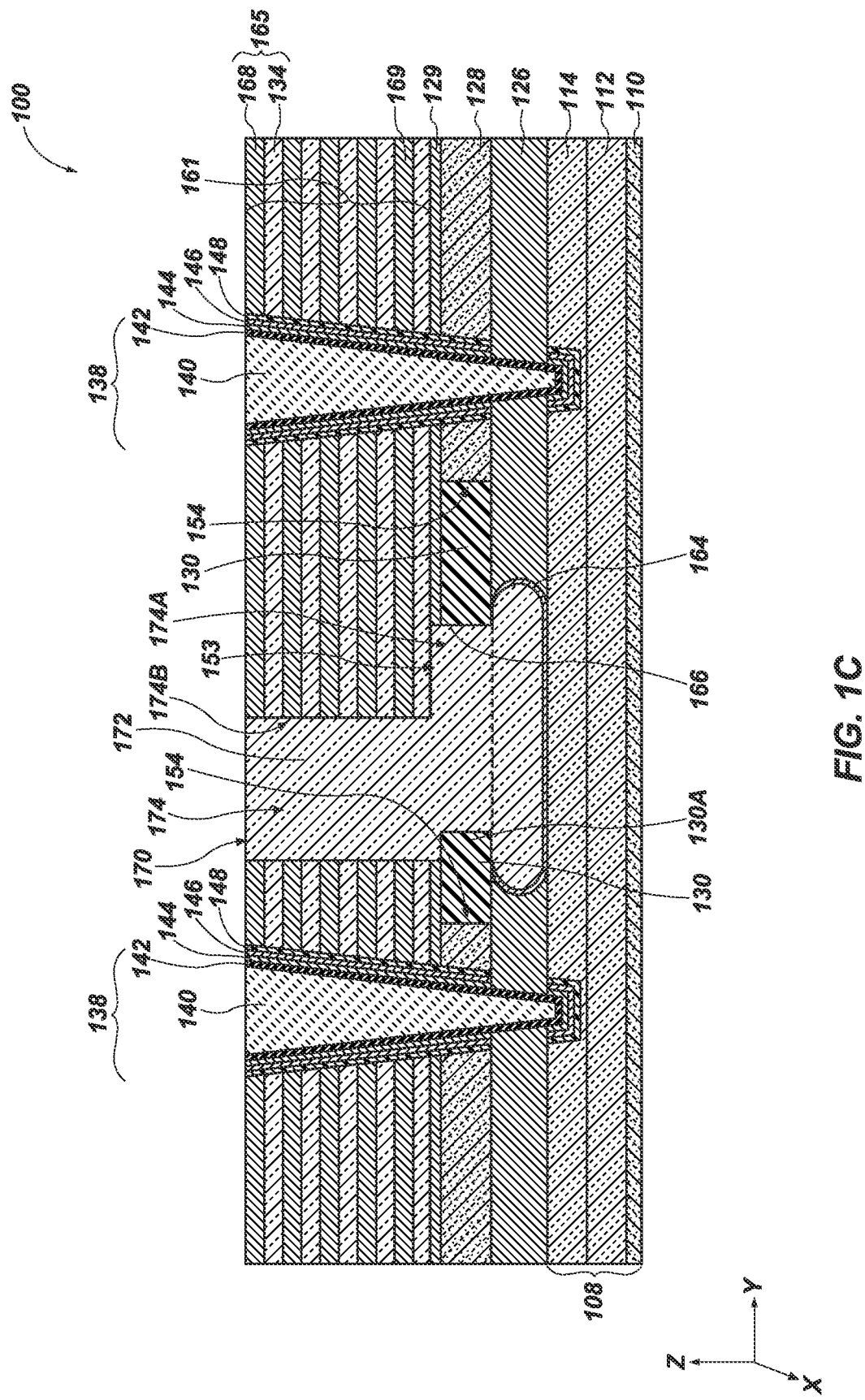
Figure 1D:
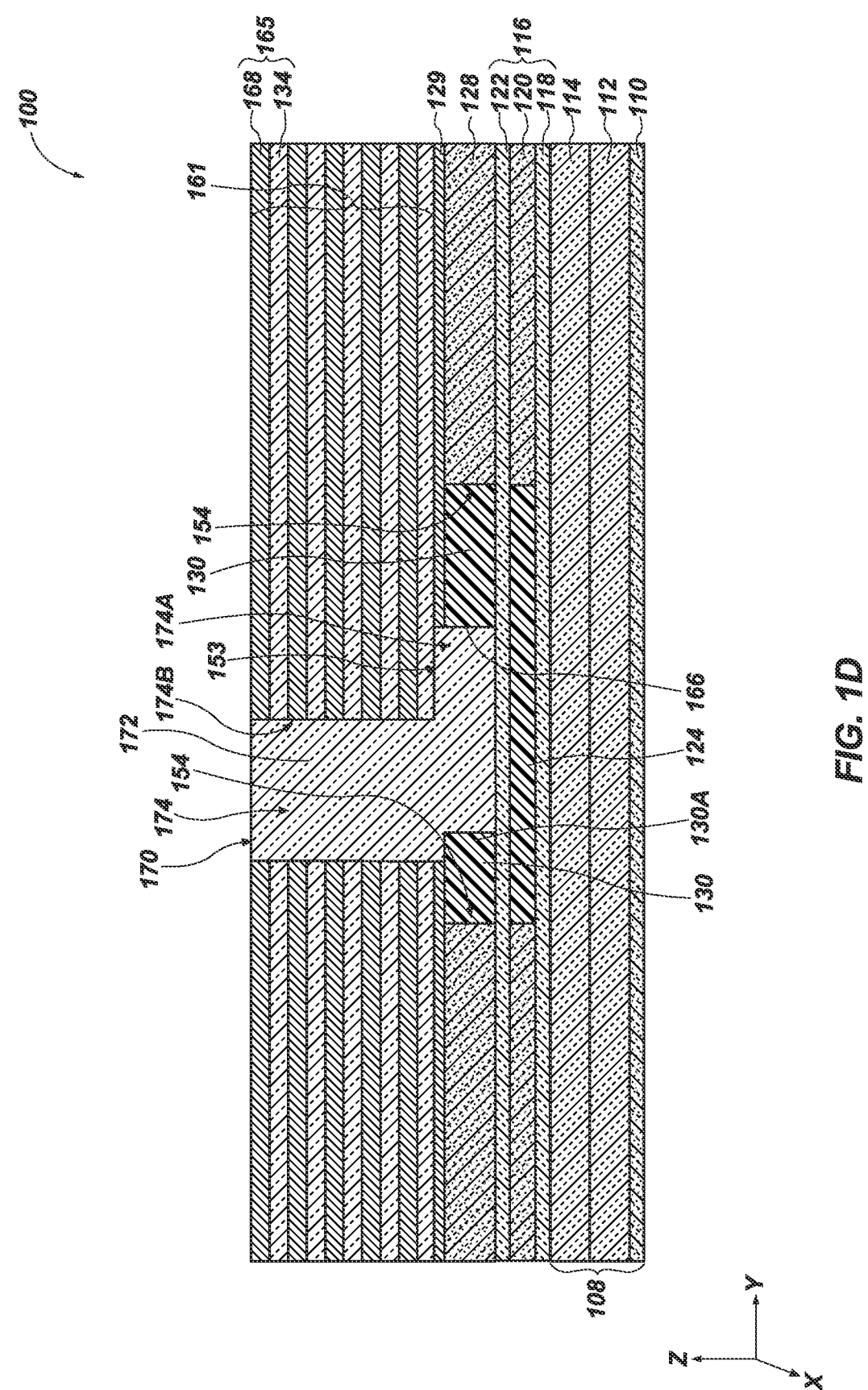

FIG. 1A is a simplified, partial top-down view of a microelectronic device structure 100 (e.g., a memory structure) for a microelectronic device (e.g., a memory device, such as a three-dimensional (3D) NAND Flash memory device). FIGS. 1B, 1C, and 1D are simplified, partial cross-sectional views of the microelectronic device structure 100 taken about dashed lines B-B, C-C, and D-D in FIG. 1A, respectively. FIGS. 2A through 4B are simplified, partial cross-sectional views (FIGS. 2A through 3C) and simplified, partial top-down views (FIGS. 4A and 4B) illustrating different processing stages of a method of forming the microelectronic device structure 100 of FIG. 1A. With the description provided below, it will be readily apparent to one of ordinary skill in the art that the methods and structures described herein may be used for forming various devices. In other words, the methods of the disclosure may be used whenever it is desired to form a microelectronic device. For convenience in describing FIGS. 1A through 4B, a first horizontal direction may be defined as the X-direction shown in some of FIGS. 1A through 4B; a second horizontal direction transverse (e.g., orthogonal, perpendicular) to the first horizontal direction may be defined as the Y-direction shown in some of FIGS. 1A through 4B; and a third direction (e.g., a vertical direction) transverse (e.g., orthogonal, perpendicular) to each of the first horizontal direction and the second horizontal direction may be defined the Z-direction shown in some of FIGS. 1A through 4B. Similar directions are shown in FIG. 5, which is discussed in further detail below.

Referring collectively to FIGS. 1A and 1B, the microelectronic device structure 100 may be divided into multiple regions in a first horizontal direction (e.g., the X-direction). For example, in the X-direction depicted in FIGS. 1A and 1B, the microelectronic device structure 100 may include at least one array region 102, at least one staircase region 104 (e.g., at least one access line contact region), and at least one intervening region 106 horizontally interposed (e.g., in the X-direction) between the array region 102 and the staircase region 104. In FIG. 1A, interfaces between horizontally boundaries of different horizontal regions (e.g., the array region 102, the staircase region 104, the intervening region 106) of the microelectronic device structure 100 are depicted by way of dashed lines. Additional features (e.g., additional structures, additional materials, additional devices) facilitating desirable functions and characteristics of the microelectronic device structure 100 may be formed in the different horizontal regions (e.g., the array region 102, the staircase region 104, and the intervening region 106) of the microelectronic device structures 100, as described in further detail below. For ease of understanding the disclosure, formation of the array region 102 is illustrated in FIGS. 2A through 2J, and formation of the staircase region 104 is illustrated in FIGS. 3A through 3C. However, one of ordinary skill in the art will recognize and appreciate that the staircase region 104 and the intervening region 106 may be formed during (e.g., substantially simultaneous with) formation of the array region 102.

As shown in FIG. 1B, the microelectronic device structure 100 includes a source stack 108 (e.g., a source structure) that includes one or more conductive materials, such as conductive material 110 (e.g., conductive liner material), source material 112 over the conductive material 110, and a doped semiconductive material 114 over the source material 112. A source contact structure 116 vertically overlies the source stack 108. The source contact structure 116 may include a first material 118, a second material 120 over the first material 118, and a third material 122 over the second material 120. The source contact structure 116 may initially be formed within each of the array region 102, the staircase region 104, and the intervening region 106 of the microelectronic device structure 100, and portions of the source contact structure 116 (e.g., sacrificial portions thereof) may be subsequently removed from within the array region 102 prior to formation of additional materials formed therein by selectively replacing the sacrificial portions of the source contact structure 116 with conductive material, as described in greater detail below.

A source contact 126 (e.g., a lateral contact structure, a lateral contact region) vertically overlies the source stack 108 within a horizontal area of the array region 102. The source contact 126 may be in locations previously occupied by the sacrificial portions of the source contact structure 116 within the array region 102. Thus, the source contact 126 may be horizontally adjacent to and at substantially the same vertical position as portions of the source contact structure 116 within horizontal areas of the staircase region 104 and the intervening region 106. A cap material 128 (e.g., semiconductive material) may be formed on or over the source contact 126 within the horizontal area of the array region 102 and may be formed on or over the source contact structure 116 within the horizontal areas of the staircase region 104 and the intervening region 106. Optionally, one or more dielectric cap materials 129 may be formed on or over the cap material 128.

The source contact 126 may at least be present within the horizontal area of the array region 102. In some embodiments, the source contact 126 is substantially confined within the horizontal area of the array region 102. In additional embodiments, depending on the horizontal geometric configurations of the remaining portions of the source contact structure 116, the source contact 126 extends beyond the horizontal area of the array region 102. For example, if the remaining portions of the source contact structure 116 horizontally extend into only a portion of the intervening region 106, the source contact 126 may horizontally extend into the intervening region 106. The source contact 126 may not substantially horizontally extend into the staircase region 104. The staircase region 104 may be substantially free of the source contact 126.

The microelectronic device structure 100 includes one or more implant regions, such as at least one first implant region 124 and at least one second implant region 130. The first implant region 124 (e.g., an etch-resistant region) may be horizontally positioned within one or more of the staircase region 104 and the intervening region 106 (e.g., external to the array region 102). As such, the first implant region 124 may be located relatively remote from the source contact 126, and may be located relatively more horizontally proximate and at substantially the same vertical position as the source contact 126. The first implant region 124 may be formed within the second material 120 of the source contact structure 116. In addition, the second implant region 130 (e.g., an additional etch-resistant region) may be formed within portions of the cap material 128 within one or more (e.g., each) of the array region 102, the staircase region 104, and the intervening region 106 of the microelectronic device structure 100. The second implant region 130 may be formed at a vertical elevation above the source contact 126, and the first implant region 124 may be formed at substantially the same vertical elevation as the source contact 126. As such, an upper boundary of the second implant region 130 may vertically overlie an upper boundary (e.g., an upper surface) of the source contact 126, and an upper boundary of the first implant region 124 may vertically underlie the upper boundary of the source contact 126.

Materials of the first implant region 124 and the second implant region 130 may be formulated to be resistant to removal under some etch conditions, so that various dielectric materials and semiconductive materials are selectively etchable relative to the materials of the first implant region 124 and the second implant region 130. As shown in FIG. 1B, one first implant region 124 may be present within a horizontal area the staircase region 104, and multiple second implant regions 130 may be present within horizontal areas the array region 102 and the staircase region 104 of the microelectronic device structure 100.

As shown in FIG. 1B, multiple tiers 165 may vertically overlie the cap material 128, and may individually include insulative material 134 (e.g., insulative structure) and conductive material 168 (e.g., conductive structure) vertically adjacent the insulative material. If present, the dielectric cap material 129 may vertically intervene between the tiers 165 and the cap material 128. The conductive material 168 of some of the tiers 165 may be employed as access line structures (e.g., word line structures). In addition, the conductive material 168 of one or more of the tiers 165 relatively proximate to the cap material 128 may be employed as first select line structures (e.g., select gate source (SGS) structures), and the conductive material 168 of one or more of the tiers 165 relatively distal from the cap material 128 may be employed as second select line structures (e.g., select gate drain (SGD) structures). The tiers 165 together form a tiered stack 161 (e.g., a stack structure) on or over the cap material 128. In some embodiments, the conductive materials 168 are formed through so-called "replacement gate" or "gate last" processing methodologies.

As shown in the top-down view FIG. 1A, the microelectronic device structure 100 further includes slots 150 (e.g., filled slots) vertically extending through the tiered stack 161. For example, the slots 150 may include a fill material (e.g., one or more dielectric materials) of a slot structure, as described in greater detail with reference to FIG. 2J. The slots 150 may divide (e.g., partition) the tiered stack 161 into blocks 151 horizontally separated from one another by the slots 150 in a first horizontal direction (e.g., the X-direction) and in a second horizontal direction (e.g., the Y-direction) orthogonal to the first horizontal direction. For example, the slots 150 may horizontally surround (e.g., in the Y-direction and in the X-direction) the blocks 151, and the slots 150 may be horizontally interposed between horizontally neighboring blocks 151. In addition, the slots 150 may also divide one or more of the source contact 126, the cap material 128, and the dielectric cap material 129, if present, into multiple segments individually confined within horizontal boundaries of individual blocks 151 horizontally separated from one another by the slots 150.

The slots 150 may include first slots 150A horizontally extending in the first horizontal direction (e.g., the X-direction), and second slots 150B horizontally extending in the second horizontal direction (e.g., the Y-direction) orthogonal to the first horizontal direction. The first slots 150A may horizontally intersect the second slots 150B, and may be integral and continuous with the second slots 150B. The first slots 150A may be horizontally interposed between the blocks 151 (and, hence, segments of the cap material 128) horizontally neighboring one another in the Y-direction; and the second slots 150B may be horizontally interposed between the blocks 151 (and, hence, segments of the cap material 128) horizontally neighboring one another in the X-direction. The slots 150, including the first slots 150A and the second slots 150B thereof, may also be horizontally interposed between segments of the source contact 126 within the array region 102. As shown in FIG. 1B, the second implant region 130 of the cap material 128 may horizontally neighbor the slots 150 within each of the array region 102, the staircase region 104, and the intervening region 106. Since the slots 150 are horizontally interposed between segments of the cap material 128, the slots 150 may be horizontally interposed between segments of the second implant region 130 of the cap material 128. The slots 150 may vertically overlie (e.g., in the Z-direction) remaining portions of the source contact structure 116 including first implant region 124. However, the disclosure is not so limited, and additional configurations may be contemplated. The slots 150, including the first slots 150A and the second slots 150B thereof, may be filled with insulative (e.g., dielectric) material, as described in further detail below.

Referring to FIG. 1B, cell pillar structures 138 (e.g., pillars, memory pillars) are formed to vertically extend through the tiers 165 of the tiered stack 161, as well as the dielectric cap material 129 (if present), the cap material 128, the source contact 126, and at least partially vertically extend into the doped semiconductive material 114 of the source stack 108. Intersections of the cell pillar structures 138 and the conductive materials 168 of some of the tiers 165 of the tiered stack 161 may define vertically extending strings of memory cells 176 coupled in series with one another within the tiered stack 161. The cell pillar structures 138 may be located within horizontal areas of the tiered stack 161 corresponding to intersecting portions (e.g., horizontally overlapping portions) of the array region 102 and the blocks 151 of the microelectronic device structure 100. The cell pillar structures 138 are located outside of horizontal boundaries of the first implant region 124 and the second implant region 130.

As shown in FIG. 1B, the tiered stack 161 includes at least one staircase structure 178 on or over the cap material 128 overlying the source contact structure 116. The tiered stack 161 may horizontally extend (e.g., in the X-direction and the Y-direction) throughout the array region 102, the staircase region 104, and the intervening region 106 of the microelectronic device structure 100. The staircase structure 178 may be horizontally confined within the horizontal area of the staircase region 104 of the microelectronic device structure 100.

The staircase structure 178 may horizontally extend (e.g., in the X-direction) across portions of the blocks 151 of the tiered stack 161 and the slots 150 horizontally interposed (e.g., in the X-direction) between the blocks 151. The staircase structure 178 includes steps 180 at least partially defined by horizontal ends (e.g., in the X-direction) of the tiers 165 of the tiered stack 161. Treads of the steps 180 of the staircase structure 178 may be employed as contact regions to electrically connect the conductive materials 168 of the tiers 165 to other features (e.g., control logic devices) of the microelectronic device structure 100. A quantity of steps 180 included in the staircase structure 178 may be substantially the same as (e.g., equal to) or may be different than (e.g., less than, greater than) the quantity of the tiers 165 in the tiered stack 161.

In some embodiments, the steps 180 of the staircase structure 178 are arranged in order, such that the steps 180 directly horizontally adjacent one another in the X-direction correspond to the tiers 165 of the tiered stack 161 directly vertically adjacent (e.g., in the Z-direction) one another. In additional embodiments, the steps 180 of the staircase structure 178 are arranged out of order, such that at least some of the steps 180 of the staircase structure 178 directly horizontally adjacent one another in the X-direction correspond to the tiers 165 of the tiered stack 161 not directly vertically adjacent (e.g., in the Z-direction) one another. The staircase structure 178 may vertically overlie (e.g., in the Z-direction) the source contact structure 116, including the first implant region 124 within portions thereof. The first implant region 124 may be within horizontal boundaries of the staircase structure 178.

The microelectronic device structure 100 may further include additional features within portions of the intervening region 106 horizontally overlapping the blocks 151. Non-limiting examples of such further features include dummy structures 192 and deep contact structures 193. The dummy structures 192, if any, may comprise pillar structures that are and/or that will be electrically disconnected from other features (e.g., conductive structures, such as conductive lines) of the microelectronic device structure 100; and/or that do not and/or will not facilitate electrical communication between the other features of the microelectronic device structure 100. The dummy structures 192 may, for example, be employed to mitigate damage to and/or defects at edges of arrays of the cell pillar structures 138 (e.g., commonly referred to as "array edge effects").

If formed, the dummy structures 192 may horizontally neighbor outermost (e.g., in the X-direction) cell pillar structures 138, such as cell pillar structures 138 positioned relatively closest to horizontal boundaries (e.g., in the X-direction) of the array region 102 of the microelectronic device structure 100. The dummy structures 192 may be formed and positioned within horizontal areas of the tiered stack 161 corresponding to intersecting portions (e.g., horizontally overlapping portions) of the intervening region 106 and the blocks 151 of the microelectronic device structure 100. The dummy structures 192 may vertically extend through the tiers 165 of the tiered stack 161 to the source contact structure 116, for example. The dummy structures 192 may vertically terminate at or within the source contact 126 and/or at or within the source contact structure 116, such as at or within the third material 122, or at or within the second material 120 thereof, without vertically extending to the source stack 108.

The dummy structures 192, if any, may be formed of and include one or more materials (e.g., insulative materials, conductive materials, semiconductive materials) able to alleviate undesirable array edge effects for arrays of the cell pillar structures 138 within the blocks 151. In some embodiments, the dummy structures 192 comprise dielectric structures. In additional embodiments, the dummy structures 192 comprise semiconductive structures. In further embodiments, the dummy structures 192 comprise conductive structures. In yet further embodiments, the dummy structures 192 comprise pillar structures substantially similar to the cell pillar structures 138, but that will not be electrically connected to one or more conductive structures (e.g., conductive lines, such as digit lines; lateral contact structures) that the cell pillar structures 138 will be electrically connected to. In such embodiments, the cell pillar structures 138 may be considered "active" cell pillar structures, and the dummy structures 192 may be considered "inactive" cell pillar structures.

The deep contact structures 193 may be formed and positioned within horizontal areas of the tiered stack 161 corresponding to intersecting portions (e.g., horizontally overlapping portions) of the intervening region 106 and the blocks 151 of the microelectronic device structure 100. The deep contact structures 193 may vertically extend through the tiers 165 of the tiered stack 161, through the source contact 126 and/or the source contact structure 116, and to the source stack 108 (e.g., the doped semiconductive material 114) of the microelectronic device structure 100. One or more of the deep contact structures 193 may be configured and positioned to electrically connect one or more features associated with the source stack 108 (e.g., conductive materials, the contact structures) to one or more conductive features (e.g., additional contact structures, conductive line structures) to subsequently be formed over upper vertical boundaries of the tiered stack 161. Optionally, one or more other of the deep contact structures 193 may be configured and positioned to serve as support structures for during processing of the tiered stack 161, such as during replacement gate processing of the tiered stack 161. The one or more other of the deep contact structures 193 may, for example, be configured and positioned to provide support to the tiered stack 161 at or proximate the staircase structure 178 to mitigate tier 165 collapse at or proximate the staircase structure 178 during the replacement gate processing. In some embodiments, the one or more other of the deep contact structures 193 are positioned to be electrically disconnected from the conductive features (e.g., additional contact structures, conductive line structures) to subsequently be formed over the upper vertical boundaries of the tiered stack 161.

The deep contact structures 193 may individually be formed of and include at least one conductive material, and at least one insulative liner material substantially horizontally surrounding and covering (e.g., across an entire vertical height of) the conductive material. In some embodiments, the conductive material of the deep contact structures 193 comprises W. In additional embodiments, the conductive material of the deep contact structures 193 comprises conductively doped polysilicon. The insulative liner material may be formed of and include at least one insulative material. In some embodiments, the insulative liner material of the deep contact structures 193 is formed of and includes $SiO_x$ (e.g., $SiO_2$).

FIGS. 1C and 1D are simplified, cross-sectional views illustrating the microelectronic device structure 100 shown in FIG. 1A. The cross-sectional view of FIG. 1C is taken about the dashed line C-C within the array region 102 depicted in FIG. 1A, and the cross-sectional view of FIG. 1D is taken about the dashed line D-D within the staircase region 104 depicted in FIG. 1A. As shown in FIG. 1C, the tiers 165 of the tiered stack 161 vertically overlie the cap material 128. Within the array region 102 of the microelectronic device structure 100, the cap material 128 vertically overlies and horizontally overlaps the source contact 126. The conductive material 168 of one or more of the tiers 165 of the tiered stack 161 relatively proximate to the cap material 128 may be employed as an SGS structure 169.

The cell pillar structures 138 vertically extend through the tiers 165 of the tiered stack 161, the dielectric cap material 129, if present, the cap material 128, the source contact 126, and at least partially vertically extend into the doped semiconductive material 114 of the source stack 108. While FIG. 1C illustrates the cell pillar structures 138 as extending partially into the doped semiconductive material 114, the cell pillar structures 138 may extend through the doped semiconductive material 114 and contact the source material 112, without contacting the conductive material 110. The cell pillar structures 138 may individually include a fill material 140, a channel material 142, a tunnel dielectric material 144, a charge trap material 146, and a charge blocking material 148. The tunnel dielectric material 144, the charge trap material 146, and the charge blocking material 148 may function as tunneling structures of the cell pillar structures 138 of the microelectronic device structure 100.

As shown in FIG. 1C, the source contact 126 is in direct contact with a lower surface (e.g., a lower horizontal surface) of the cap material 128 and in direct contact with an upper surface (e.g., an upper horizontal surface) of the doped semiconductive material 114. The source contact 126 is also in direct contact with a portion of the cell pillar structures 138, such as directly contacting upper horizontal surfaces (e.g., horizontally oriented upper surfaces) and lower horizontal surfaces (e.g., horizontally oriented lower surfaces) of the tunnel dielectric material 144, the charge trap material 146, and the charge blocking material 148 and directly contacting the channel material 142. The tunnel dielectric material 144, the charge trap material 146, and the charge blocking material 148 of the cell pillar structures 138 are separated into discrete (e.g., discontinuous) portions that extend vertically above and vertically below the source contact 126, while the channel material 142 and the fill material 140 extend substantially continuously across an entire vertical height of the cell pillar structures 138. The fill material 140 may, optionally, include an interior void (e.g., hollow portion, air gap). For example, the source contact 126 may segment portions of the tunnel dielectric material 144, the charge trap material 146, and the charge blocking material 148 from additional portions thereof. The source contact 126 is separated from (e.g., isolated from) a lowermost tier 165 (e.g., the SGS structure 169) of the tiered stack 161 by the cap material 128 and, optionally, by the dielectric cap material 129. Thus, the second implant region 130 of the cap material 128 may vertically separate the source contact 126 from the SGS structure 169. One or more of the second implant region 130 of the cap material 128, the source contact 126, and the doped semiconductive material 114 may, optionally, include an oxidized portion 164, as described in greater detail below.

The microelectronic device structure 100 may include a slot structure 170 including a fill material 172 (e.g., one or more dielectric materials) within and at least partially filling the slots 150 (FIG. 1A). For example, a dielectric structure 174 formed of and including the fill material 172 may vertically extend through the tiered stack 161, through the dielectric cap material 129 (if present), and through the cap material 128. In some embodiments, the dielectric structure 174 includes a lower portion 174A and an upper portion 174B. The dielectric structure 174 may transition from the upper portion 174B to the lower portion 174A at a vertical position (e.g., in the Z-direction) within vertical boundaries of dielectric cap material 129 (if present), or at a vertical position within vertical boundaries of the cap material 128. The lower portion 174A of the dielectric structure 174 may be located within undercut regions 153 vertically underlying and horizontally overlapping the tiers 165 of the tiered stack 161. Further, one or more side surfaces (e.g., lateral side surfaces, horizontal side surfaces) of the fill material 172 may directly contact side surfaces of the second implant region 130 of the cap material 128 along an interface 166. Since the slots 150 divide the second implant region 130 of the cap material 128 into multiple segments, segmented portions of the second implant region 130 of the cap material 128 horizontally neighbor and directly contact the fill material 172 of the slot structure 170 on two opposing sides. Additional portions of the fill material 172 of the slot structure 170 may vertically extend through the source contact 126. The additional portions of the fill material 172 may be disposed vertically adjacent to (e.g., under) the dielectric structure 174 and on (e.g., vertically adjacent to, horizontally adjacent to) the oxidized portion 164. The slot structure 170 includes the dielectric structure 174, including the lower portion 174A and the upper portion 174B thereof, as well as the additional portions of the fill material 172 laterally adjacent to the source contact 126.

Additionally, on at least one side of the dielectric structure 174 in the second horizontal direction (e.g., the Y-direction), portions of the cap material 128 that do not include the second implant region 130 may be horizontally recessed relative to the horizontally boundaries of the tiers 165 of the tiered stack 161 and the dielectric cap material 129, both of which contact the dielectric structure 174 and are directly laterally adjacent to the dielectric structure 174. For example, on at least one side (e.g., lateral side, horizontal side) of the dielectric structure 174 in the Y-direction, portions of the cap material 128 not including the second implant region 130 may terminate in the Y-direction at opposing lateral edge surfaces that are spaced apart from the dielectric structure 174 by additional portions of the cap material 128 including and at least partially defining second implant region 130. As a non-limiting example, portions of the cap material 128 not within a horizontal area of the second implant region 130 may terminate in the Y-direction at lateral boundaries 154 that are spaced apart from the dielectric structure 174. The second implant region 130 of the cap material 128 laterally intervenes between the dielectric structure 174 and non-implanted regions of the cap material 128. The lateral boundaries 154 may or may not be at substantially equal distances from the dielectric structure 174.

Accordingly, the second implant region 130 of the cap material 128 is horizontally interposed (e.g., in the Y-direction) between the lateral boundaries 154 of additional regions (e.g., portions, sections) of the cap material 128 and the dielectric structure 174 of individual slot structures 170. Moreover, the second implant region 130 of the cap material 128 is vertically interposed (e.g., in the Z-direction) between the dielectric cap material 129 and the source contact 126, and may at least substantially span a vertical distance between the dielectric cap material 129 and the source contact 126. For example, segmented portions of the second implant region 130 may be between the opposing lateral boundaries 154 of additional, non-implanted regions of the cap material 128 and the dielectric structure 174 in the Y-direction, and may be between the dielectric cap material 129 and the source contact 126 in the Z-direction. At least a portion of the second implant region 130 of the cap material 128 may horizontally overlap with the tiers 165 of the tiered stack 161.

As shown in FIG. 1C, at least a portion (e.g., portion 130A) of the second implant region 130 may horizontally overlap the upper portion 174B of the dielectric structure 174. Further, the additional portions of the fill material 172 may segment portions of the source contact 126. Accordingly, the portion 130A of the second implant region 130 may also horizontally overlap the additional portions of the fill material 172 vertically underlying the dielectric structure 174, such that the second implant region 130 is substantially surrounded by the fill material 172 on at least three sides.

Referring to FIG. 1D, within the horizontal area of the staircase region 104 of the microelectronic device structure 100, the cap material 128 is formed on or over the source contact structure 116 (e.g., on or over the third material 122 thereof). The source contact structure 116 is in direct contact with the lower surface (e.g., the lower horizontal surface) of the cap material 128 and in direct contact with the upper surface (e.g., the upper horizontal surface) of the doped semiconductive material 114 of the source stack 108. For example, the third material 122 of the source contact structure 116 is in direct contact with the lower surface of the cap material 128, and the first material 118 of the source contact structure 116 is in direct contact with the upper surface of the doped semiconductive material 114. The second material 120 of the source contact structure 116 directly intervenes between the first material 118 and the third material 122 thereof. Since the first implant region 124 is formed within the second material 120 of the source contact structure 116, the first implant region 124 vertically intervenes between the cap material 128 and the doped semiconductive material 114.

As in the array region 102 (FIG. 1C) of the microelectronic device structure 100, portions of an individual slot structure 170 within the staircase region 104 are formed of include the fill material 172. For example, the dielectric structure 174 of an individual slot structure 170, including the lower portion 174A and the upper portion 174B thereof, may also be present within the staircase region 104 of the microelectronic device structure 100. Portions of the cap material 128 outside of the horizontal boundaries of the second implant region 130 may terminate in the Y-direction at the lateral boundaries 154 spaced apart from the dielectric structure 174 by portions of the second implant region 130.

The second implant region 130 of the cap material 128 may extend through each of the array region 102, the staircase region 104, and the intervening region 106 of the microelectronic device structure 100, as discussed in greater detail below with reference to FIG. 4A. In addition, the first implant region 124 of the second material 120 of the source contact structure 116 may extend through the staircase region 104 and the intervening region 106, as discussed in greater detail below with reference to FIG. 4B. The first implant region 124 of the second material 120 of the source contact structure 116 may horizontally extend within each of the staircase region 104 and the intervening region 106, without horizontally extending within the array region 102 or, alternatively, the first implant region 124 of the second material 120 of the source contact structure 116 may also extend within a portion of the array region 102 proximal the intervening region 106.

The first implant region 124 of the second material 120 of the source contact structure 116 is positioned between opposing lateral boundaries of non-implant regions of the second material 120 of the source contact structure 116. Moreover, the first implant region 124 of the second material 120 is between the third material 122 and the first material 118 of the source contact structure 116 in the Z-direction, and may at least substantially span a vertical distance therebetween. The first implant region 124 of the second material 120 of the source contact structure 116 may horizontally overlap (e.g., in the Y-direction) the second implant region 130 of the cap material 128. At least a portion of the first implant region 124 of the second material 120 of the source contact structure 116 may horizontally overlap the tiers 165 of the tiered stack 161.

As discussed above, FIGS. 2A through 2J illustrate different processing stages, as viewed within the array region 102, of a method of forming the microelectronic device structure 100. The array region 102 of the microelectronic device structure 100 may be formed during (e.g., substantially simultaneous with) formation of the staircase region 104 of the microelectronic device structure 100, as described in greater detail below with reference to FIGS. 3A through 3C. Similarly, the intervening region 106 of the microelectronic device structure 100 may be formed during formation of the array region 102 and the staircase region 104 of the microelectronic device structure 100.

Figure 2A:
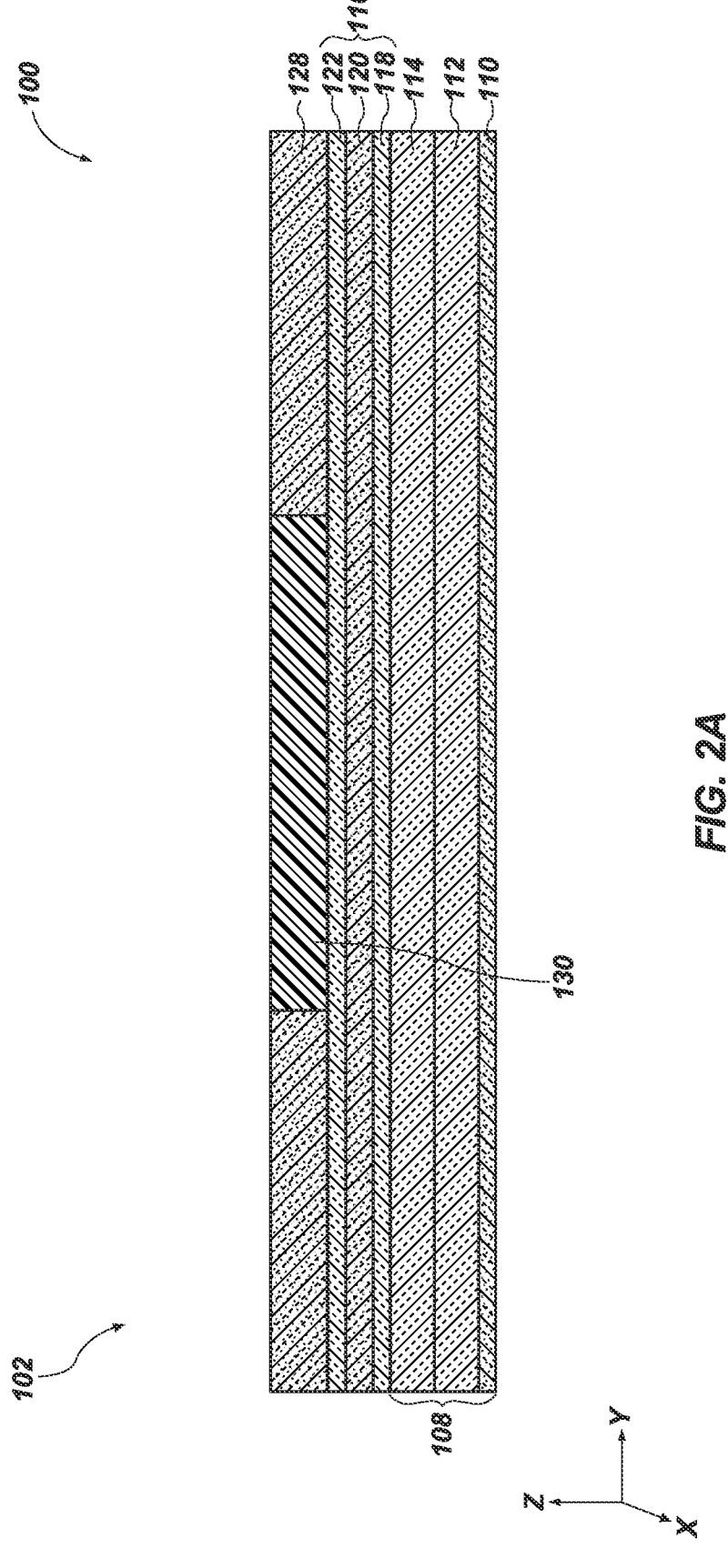
Figure 3A:
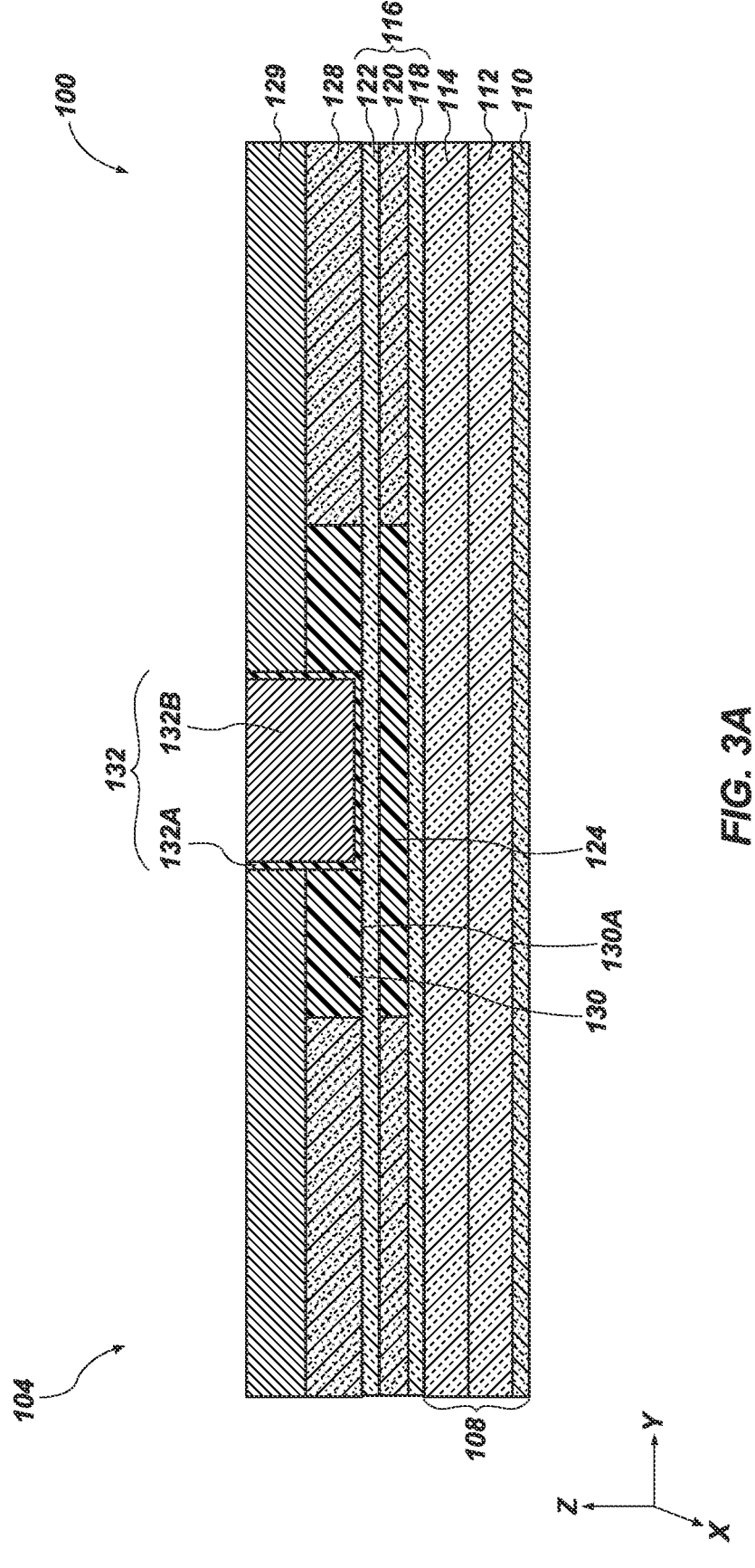
Figure 3B:
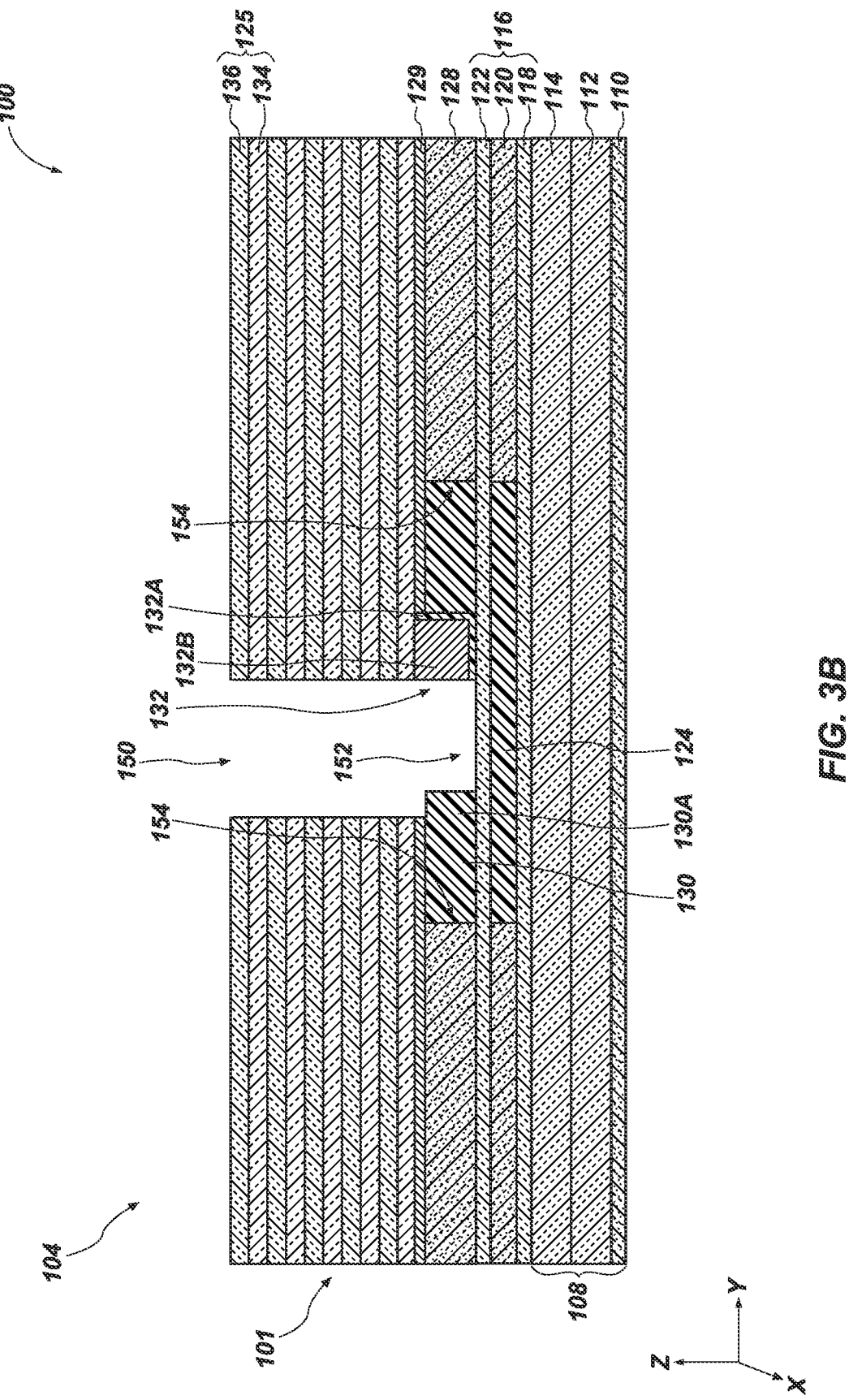
Figure 3C:
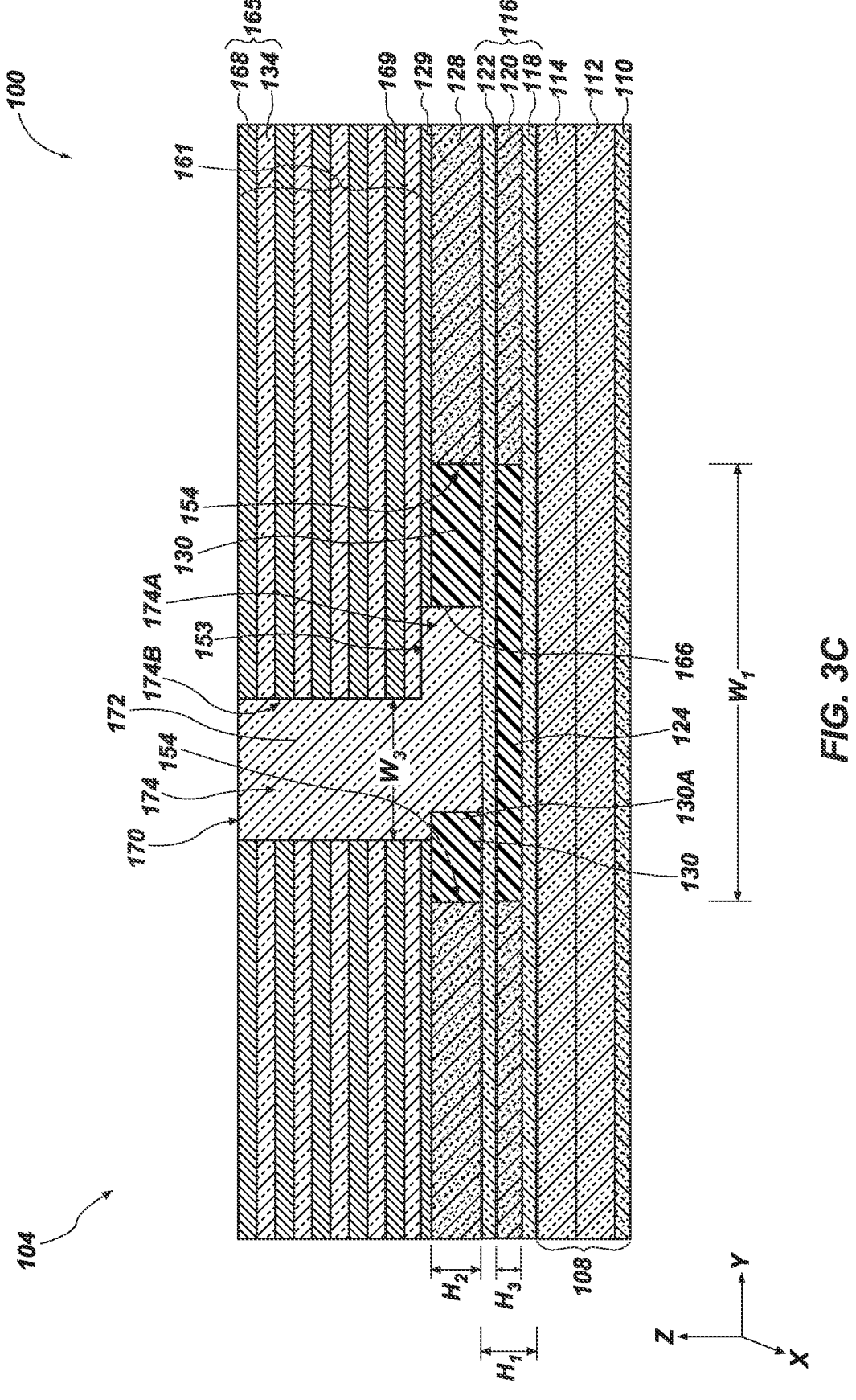

Referring to FIG. 2A, the source stack 108 (e.g., a source structure, a source region) of the microelectronic device structure 100 may be formed on or over a base material and may include one or more conductive materials. The conductive material 110 may be formed on or over the base material, the source material 112 may be formed on or over the conductive material 110, and the doped semiconductive material 114 may be formed on or over the source material 112. In some embodiments, the conductive material 110 is formed of and includes titanium nitride ($TiN_x$), the source material 112 is formed of and includes tungsten silicide ($WSi_x$), and the doped semiconductive material 114 is formed of and includes a conductively doped polycrystalline silicon (also referred to herein as "polysilicon") material. However, the conductive material 110, the source material 112, and the doped semiconductive material 114 may be formed of and include other conductive materials. Each of the conductive material 110, source material 112, and doped semiconductive material 114 may be formed by conventional techniques and to a desired vertical thickness. By way of example only, the conductive material 110 may be formed to a vertical thickness within a range of from about 20 nanometers (nm) to about 40 nm, the source material 112 may be formed to a vertical thickness within a range of from about 80 nm to about 100 nm, and the doped semiconductive material 114 may be formed to a vertical thickness within a range of from about 200 nm to about 400 nm.

The source contact structure 116 is formed on or over the source stack 108 and includes the first material 118, the second material 120, and the third material 122, each of which is formed by conventional techniques. Materials of the first material 118, the second material 120, and the third material 122 may be selectively etchable relative to one another and relative to additional materials of the microelectronic device structure 100. The first material 118 and the third material 122 may have substantially the same material composition, or may have different material compositions than one another. By way of example only, the first material 118, the second material 120, and the third material 122 may be formed of and include dielectric materials, such as a silicon oxide material or a silicon nitride material, that are selectively etchable. In some embodiments, the first material 118 comprises a conformal silicon oxide material (e.g., $SiO_2$), the second material 120 is silicon nitride, and the third material 122 is additional silicon oxide material (e.g., additional $SiO_2$) formed through a CVD process utilizing tetraethylorthosilicate (TEOS) as a precursor. However, other combinations of materials may be used. For example, the second material 120 may be formed of and include semiconductive material, such as polysilicon. In addition, the source contact structure 116 may be formed of and include two different materials, or more than three different materials. Removal of the source contact structure 116 (e.g., sacrificial portions thereof) from within the array region 102 provides lateral access for the subsequently formed source contact 126 (FIG. 1B) to contact the cell pillar structures 138 (FIG. 1B).

A location of a portion of the source contact structure 116 within the array region 102 corresponds to the location at which the source contact 126 (FIG. 1B) is ultimately formed, and a total vertical thickness of the as-formed source contact structure 116 may be determined by a desired vertical thickness of the source contact 126. Individual vertical thicknesses of each of the first material 118, the second material 120, and the third material 122 may be selected based on the desired vertical thickness of the source contact 126. By way of example only, the first material 118 may be formed to a vertical thickness within a range of from about 3 nm to about 40 nm, the second material 120 may be formed to a vertical thickness within a range of from about 10 nm to about 30 nm, and the third material 122 may be formed to a vertical thickness within a range of from about 3 nm to about 20 nm. The vertical thickness of each of the first material 118, the second material 120, and the third material 122 may be sufficient to protect cell film materials of the cell pillar structures 138 (FIG. 1B) and the source stack 108 during subsequently conducted process acts that provide access to the cell pillar structures 138 by sequentially removing portions of the cell films.

The cap material 128 is formed on or over the source contact structure 116 and may be formed by conventional techniques. The cap material 128 may be formulated to prevent removal processes from removing portions of the insulative materials 134 (FIG. 1B) during removal of the cell films. In some embodiments, the cap material 128 is formed of and includes dielectric material that is resistant to etch conditions (e.g., etch chemistries and process conditions) used during subsequent process acts. In other embodiments, the cap material 128 is formed of and includes doped polysilicon material. By way of example only, the cap material 128 may be resistant to phosphoric acid-based etch chemistries, to hydrogen fluoride (HF), or to other halogen-based etch chemistries.

A vertical thickness of the cap material 128 may be within a range of from about 40 nm to about 100 nm, such as from about 40 nm to about 60 nm, from about 60 nm to about 80 nm, or from about 80 nm to about 100 nm. The vertical thickness of the cap material 128 may be selected depending on a desired distance between the source contact 126 and the SGS structure 169 (FIG. 1C) of the tiered stack 161 (FIG. 1C). The vertical thickness of the cap material 128 may be sufficient to separate (e.g., physically separate) the source contact 126 (FIG. 1C) from the SGS structure 169 by a desired distance. The cap material 128 may also function as an etch stop material during subsequent process acts. In some embodiments, the vertical thickness of the cap material 128 is about 50 nm.

To form the second implant region 130 (e.g., an implant structure), the cap material 128 may be patterned using a patterned hardmask formed on or over the cap material 128. The patterned hardmask may be used to form the second implant region 130 at a desired location and at desired dimensions. The second implant region 130 (e.g., an etch-resistant material) may be formulated to exhibit an etch rate that is substantially different than (e.g., substantially less than) an etch rate of the cap material 128, the source contact 126 (FIG. 1B), the doped semiconductive material 114, and exposed polysilicon materials in the microelectronic device structure 100 when exposed to the same etch conditions. The second implant region 130 may, for example, be resistant to a tetramethylammonium hydroxide (TMAH)-based chemistry or other etch chemistries (e.g., phosphoric acid-based etch chemistries, ammonium hydroxide, hydrogen fluoride (HF), or other halogen-based etch chemistries) formulated to selectively remove polysilicon-based materials. By way of non-limiting example, the second implant region 130 may be formed by implanting a dopant into the cap material 128 to form the second implant region 130 thereof. The dopant may be implanted into the cap material 128 at desired locations and at desired dimensions.

The second implant region 130 of the cap material 128 may be configured and formulated to protect conductive materials (e.g., the doped semiconductive material 114) of the source stack 108 during removal processes described herein. In particular, by forming the second implant region 130, the doped semiconductive material 114 is protected from being removed (e.g., exhumed) while sacrificial structures (e.g., polysilicon materials) are removed during formation of the slots 150 (FIG. 1A) and additional openings utilized to form the source contact 126 (FIG. 1B) adjacent to the cell pillar structures 138 and to perform replacement gate processes to form the conductive materials 168 (FIG. 1B) of the tiers 165 (FIG. 1B) of a subsequently formed tiered stack 161 (FIG. 1B). Accordingly, the second implant region 130 may assist in maintaining the structure of the doped semiconductive material 114 by slowing (e.g., terminating) vertical progression of material removal during exposure to one or more etch chemistries, so as to mitigate exposure of the source material 112 during material removal processes within the microelectronic device structure 100. By slowing vertical etch of exposed polysilicon, corrosion and/or over-etch of the doped semiconductive material 114 and the source material 112 may be reduced or eliminated.

The dopant implanted into the cap material 128 within a horizontal area of the second implant region 130 may provide etch selectivity to the second implant region 130 relative to the cap material 128, the source contact 126 (FIG. 1B), the doped semiconductive material 114, and other exposed materials. By way of example only, portions of the cap material 128 may be implanted with at least one chemical species including boron, carbon, oxygen, nitrogen, gallium, or a combination thereof to form the etch-resistant material of the second implant region 130. The implant conditions and the dopant concentration may be tailored to achieve the desired etch selectivity of the cap material 128 and other exposed materials relative to the second implant region 130. For example, the second implant region 130 may be formulated to have a relatively greater etch resistance than the other exposed materials during mutual exposure to at least one etchant. By way of non-limiting example, the dopant may be provided within the cap material 128 to a total concentration within a range of from about $1 \times 10^{18}$ atoms/cm$^3$ to about $1 \times 10^{22}$ atoms/cm$^3$, such as within a range of from about $1 \times 10^{20}$ atoms/cm$^3$ to about $1 \times 10^{22}$ atoms/cm$^3$. In some embodiments, the second implant region 130 comprises a boron-doped polysilicon material or a carbon-doped polysilicon material. The dopant implant conditions and dimensions of the patterned hardmask on or over the cap material 128 are used to control the distribution of the dopant in the cap material 128, forming the second implant region 130. The dopant may be implanted to desired depths within the cap material 128. In some embodiments, the dopant is implanted so as to be distributed throughout an entire vertical thickness of the cap material 128. In additional embodiments, the dopant is implanted to a desired depth that is less than the total vertical extent of the cap material 128, such that the second implant region 130 extends through an upper portion of the cap material 128, without substantially extending through a lower portion of the cap material 128.

Figure 2B:
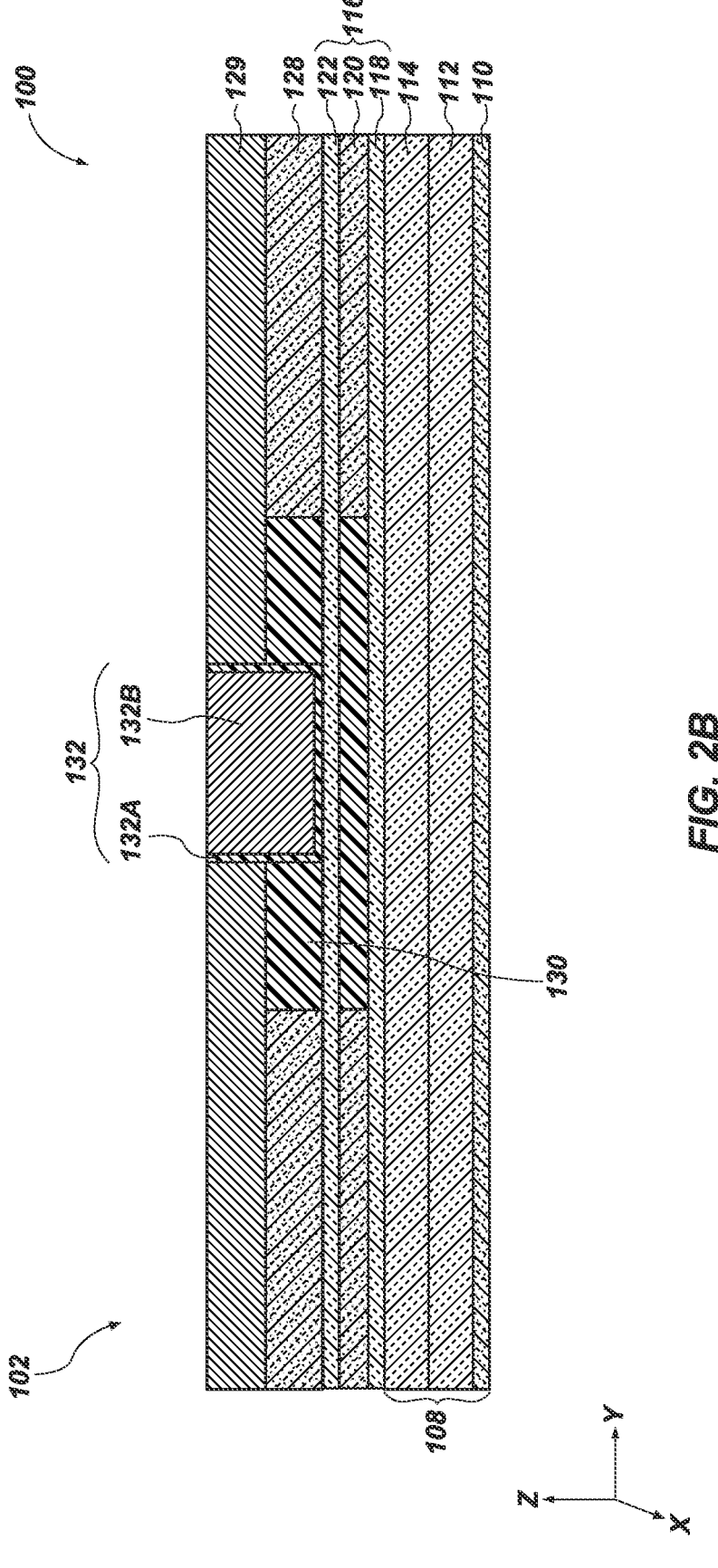

Referring to FIG. 2B, the one or more dielectric cap materials 129 (e.g., oxide cap materials) may be formed on or over the cap material 128. In addition, a slot sacrificial structure 132 may be formed in one or more of the dielectric cap materials 129 and the cap material 128. For example, the slot sacrificial structure 132 may be formed to extend through the second implant region 130 of the cap material 128. The second implant region 130 is relatively horizontally wider than the slot sacrificial structure 132 in at least one horizontal direction (e.g., the Y-direction). A horizontal center of the slot sacrificial structure 132 may be substantially aligned with a horizontal center of the second implant region 130 of the cap material 128, such that opposing portions of second implant region 130 extending between the slot sacrificial structure 132 and the additional, non-implanted regions of the cap material 128 are substantially the same as (e.g., substantially equal to) one another. While FIG. 2B illustrates the slot sacrificial structure 132 being formed following formation of the second implant region 130 for clarity, the disclosure is not so limited, and the second implant region 130 may be formed within the cap material 128 following formation of the slot sacrificial structure 132.

The slot sacrificial structure 132 may be formed of and include one or more materials that are selective etchable relative to the materials of subsequently formed tiers 125 of materials (see FIG. 2C). The slot sacrificial structure 132 may also function as an etch stop during subsequent process acts. The slot sacrificial structure 132 may extend through the dielectric cap material 129 and the cap material 128 and, optionally, partially into or through the third material 122 of the source contact structure 116. A location of the slot sacrificial structure 132 corresponds to a location adjacent to which (e.g., over which) the slots 150 (see FIG. 2D) are subsequently formed.

The slot sacrificial structure 132 may, for example, include liner material 132A and etch stop material 132B. By way of example only, the liner material 132A may include one or more of a silicon oxide material and a titanium nitride material, and the etch stop material 132B may be formed of and include tungsten. The etch stop material 132B may be configured as a plug. Alternatively, the slot sacrificial structure 132 may be formed of a single material (e.g., aluminum oxide), two materials, or more than two materials, as long as the material(s) provide the desired etch selectivity and etch stop functions. Additional portions of dielectric materials, collectively referred to herein as the dielectric cap materials 129, may, optionally, be formed on or over upper surfaces of the slot sacrificial structure 132 and the cap material 128. Alternatively, a lowermost one of the insulative materials 134 (FIG. 2C) may be formed directly over (e.g., directly on) the slot sacrificial structure 132 and the cap material 128, including the second implant region 130 thereof.

Figure 2C:
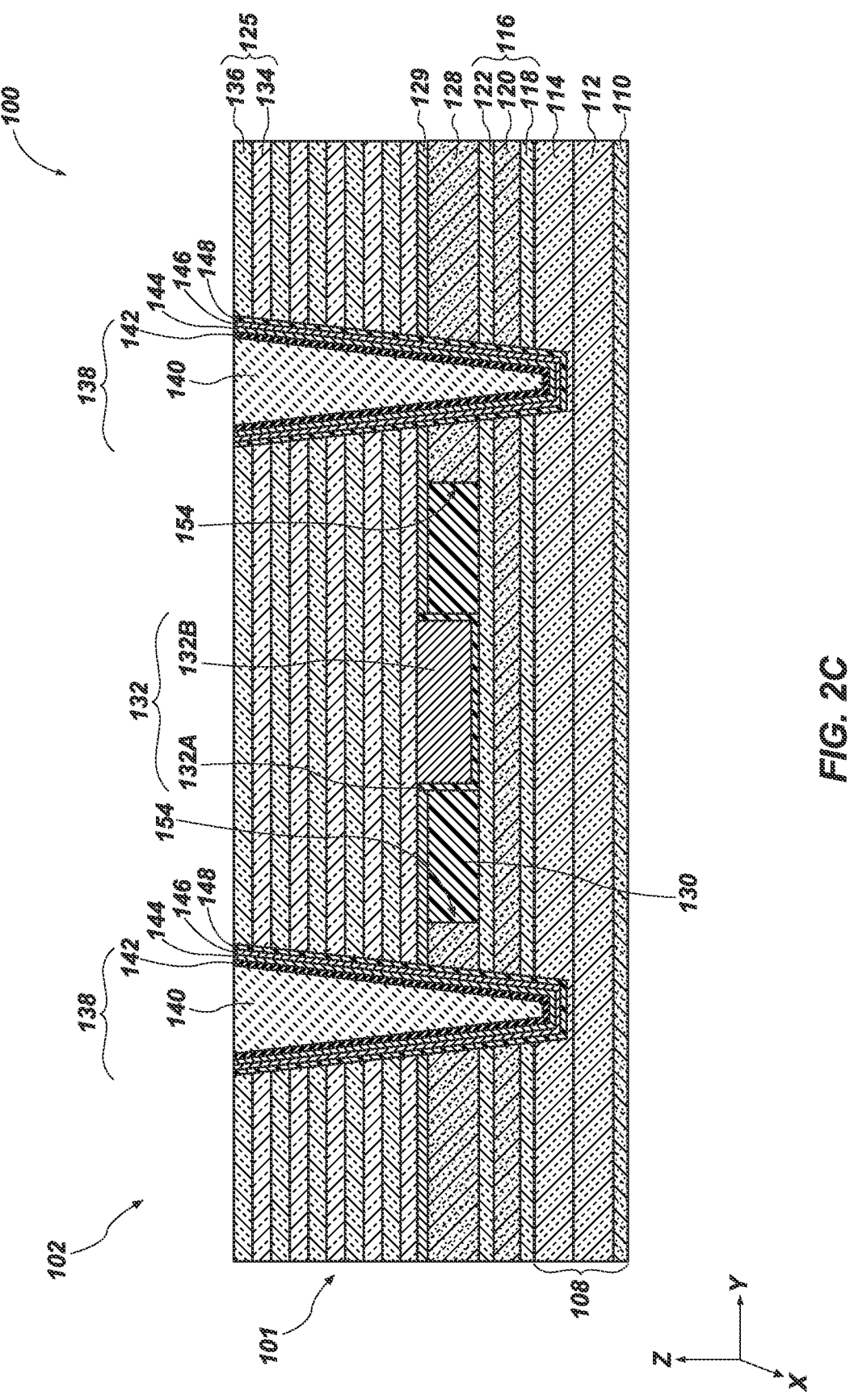

Referring to FIG. 2C, a preliminary tier stack 101 (e.g., a preliminary stack structure) including a vertically alternating sequence of insulative materials 134 (e.g., insulative structures) and additional insulative materials 136 (e.g., additional insulative structures) is formed on or over the slot sacrificial structure 132 (including the liner material 132A and the etch stop material 132B thereof) and the cap material 128 (including the second implant region 130 thereof). The preliminary tier stack 101 may include tiers 125 of the insulative materials 134 and the additional insulative materials 136, wherein each tier 125 includes insulative material 134 vertically adjacent additional insulative material 136. If present, the dielectric cap materials 129 may vertically intervene between the preliminary tier stack 101 and the cap material 128.

In addition, the cell pillar structures 138 may be formed to vertically extend (e.g., in the Z-direction) through the tiers 125 of the preliminary tier stack 101, the dielectric cap material 129 (if present), the cap material 128, and the source contact structure 116, and vertically extend at least partially into the doped semiconductive material 114. The materials of the cell pillar structures 138 may be configured and formulated to form memory cells of a memory device following subsequent processing of the microelectronic device structure 100. Materials of the cell pillar structures 138 may be formed within pillar openings and horizontally adjacent to exposed surfaces of the tiers 125, the dielectric cap material 129, the cap material 128, the source contact structure 116, and the doped semiconductive material 114. The lower portion of the cell pillar structures 138 may vertically extend into the doped semiconductive material 114 to a depth within a range of from about 100 nm to about 400 nm from the upper surface of the doped semiconductive material 114. For example, the depth of the lower portion of the cell pillar structures 138 may extend within a range of from about 100 nm to about 350 nm, such as from about 100 nm to about 300 nm, or from about 100 nm to about 250 nm from the upper surface of the doped semiconductive material 114. The cell pillar structures 138 may be separated from (e.g., isolated from) the second implant region 130 by portions of the cap material 128 not including the second implant region 130, such that the lateral boundaries 154 of the cap material 128 are horizontally offset from the cell pillar structures 138.

The cell pillar structures 138 may be formed to include multiple materials, as shown in FIG. 2C. The charge blocking material 148, the charge trap material 146, the tunnel dielectric material 144, and the channel material 142 may be conformally formed by conventional techniques. The fill material 140 may be formed adjacent to the channel material 142 by conventional techniques. One or more voids may be present in the interior of the fill material 140. The charge blocking material 148, the charge trap material 146, the tunnel dielectric material 144, the channel material 142, and the fill material 140 may be positioned in order from the outermost material to the innermost material relative to an axial centerline of the cell pillar structures 138.

The charge blocking material 148 may be formed of and include dielectric material. By way of example only, the charge blocking material 148 may be formed of and include one or more of an oxide (e.g., silicon dioxide), a nitride (silicon nitride), and an oxynitride (silicon oxynitride), or another material. In some embodiments, the charge blocking material 148 is silicon dioxide.

The charge trap material 146 may be formed of and include one or more of dielectric material (e.g., silicon nitride, silicon oxynitride), conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), and semiconductive material (e.g., polycrystalline or amorphous semiconductor material, including at least one elemental semiconductor element and/or including at least one compound semiconductor material, such as conductive nanoparticles (e.g., ruthenium nanoparticles) and/or metal dots). In some embodiments, the charge trap material 146 is silicon nitride.

The tunnel dielectric material 144 may be formed of and include dielectric material, such as one or more of dielectric oxide material, dielectric nitride material, and dielectric oxynitride material. In some embodiments, the tunnel dielectric material 144 is silicon dioxide. In some embodiments, the charge blocking material 148, the charge trap material 146, and the tunnel dielectric material 144 together form a so-called "ONO" structure that includes silicon dioxide, silicon nitride, and silicon dioxide.

The channel material 142 may be formed of and include semiconductive material. For example, the channel material 142 may be formed of and include one or more of polycrystalline silicon, a III-V compound semiconductive material, a II-VI compound semiconductive material, organic semiconductive material, GaAs, InP, GaP, GaN, and oxide semiconductive material. In some embodiments, the channel material 142 is polysilicon, such as a doped polysilicon. The channel material 142 may be configured as a so-called doped hollow channel (DHC) or other configuration. The fill material 140 may be formed of and include dielectric material, such as silicon dioxide and/or an air gap.

Figure 2D:
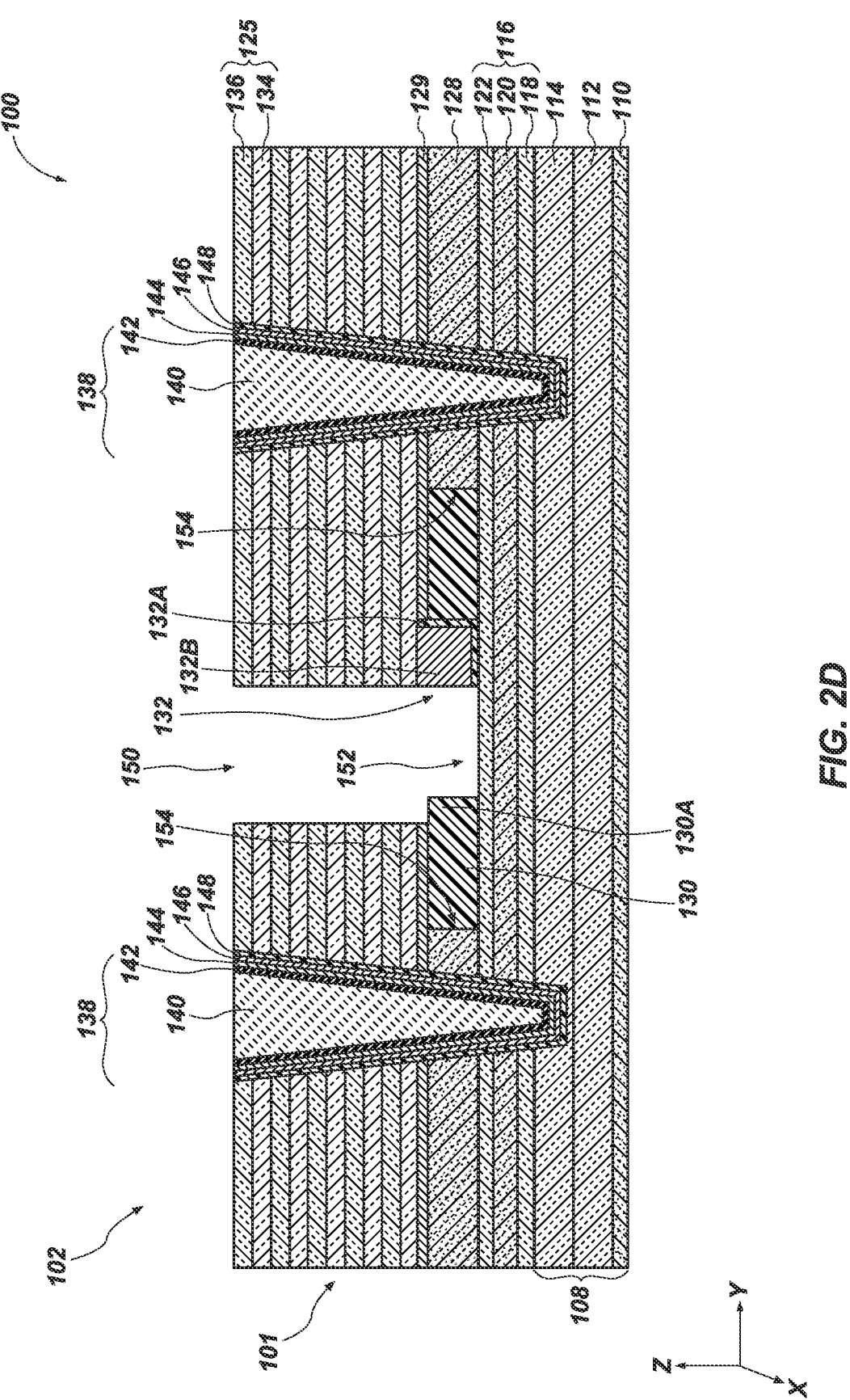

Referring to FIG. 2D, a portion of the tiers 125 of the preliminary tier stack 101 and the slot sacrificial structure 132 may be removed to form the slots 150 through the tiers 125 of the preliminary tier stack 101, as well as lower openings 152 underlying and integral with the slots 150 and within vertical boundaries of the cap material 128. The combination of the slots 150 and the lower openings 152 may expose portions of the source contact structure 116. The liner material 132A and the etch stop material 132B of the slot sacrificial structures 132 may be substantially completely removed, in some instances. Alternatively, portions of the liner material 132A and the etch stop material 132B may initially remain adjacent to the second implant region 130 of the cap material 128, such as when horizontal centers of the slots 150 are misaligned with horizontal centers of the slot sacrificial structures 132. Since materials of the tiers 125 of the preliminary tier stack 101 and the slot sacrificial structure 132 are selectively etchable relative to the second implant region 130 of the cap material 128, the portion 130A of an individual second implant region 130 thereof may partially horizontally overlap an individual slot 150, as shown in FIG. 2D. If a single etch process is conducted, portions of the tiers 125 of the preliminary tier stack 101 and the slot sacrificial structures 132 may be substantially removed by the single etch process. If more than one etch process is conducted, the etch stop material 132B of the slot sacrificial structures 132 may function as an etch stop during the first etch process to form the slots 150, and a second etch process may be subsequently conducted to at least partially (e.g., substantially) remove the slot sacrificial structures 132. For convenience, the slots 150 and the lower openings 152 are collectively referred to hereinafter as the slots 150. While FIG. 2D illustrates the slots 150 as extending through the tiers 125 of the preliminary tier stack 101 and the second implant region 130 of the cap material 128 to an upper surface of the third material 122 of the source contact structure 116, the slots 150 may extend partially into or, alternatively, through the third material 122.

The slots 150 divide the preliminary tier stack 101 into the blocks 151 (FIG. 1A). Horizontally neighboring blocks 151 may be horizontally separated from one another by substantially the same distance (e.g., corresponding to a width of an individual slot 150 in the Y-direction). Accordingly, the blocks 151 may be substantially uniformly (e.g., non-variably, equally, consistently) sized, shaped, and spaced relative to one another. In additional embodiments, at least one of the blocks 151 is formed to have a different horizontal width in the Y-direction than at least one other of the blocks 151.

Figure 2E:
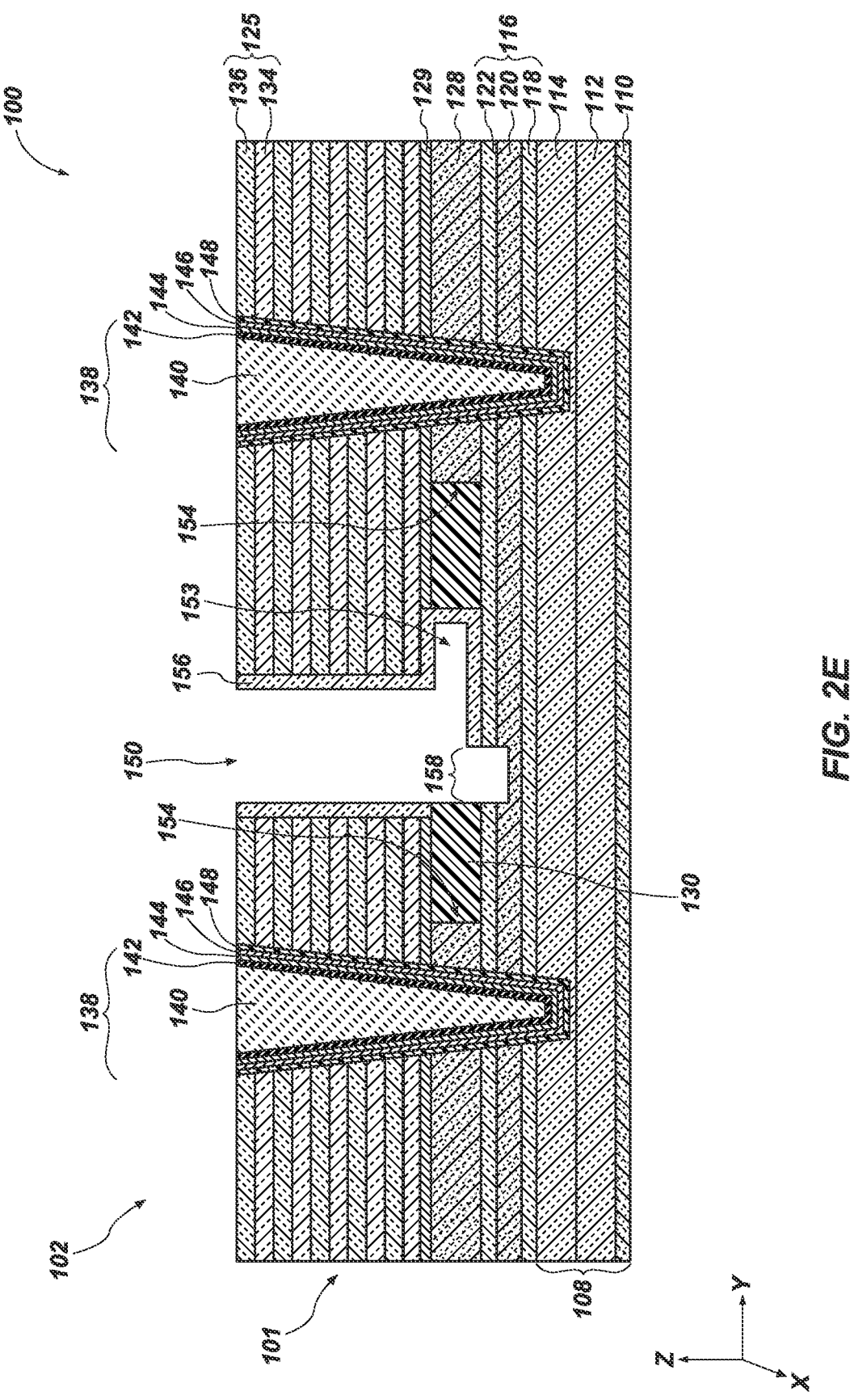

Referring to FIG. 2E, a slot liner 156 (e.g., a liner material) may be formed on exposed surfaces of the tiers 125 of the preliminary tier stack 101, the second implant region 130 of the cap material 128, and the third material 122 of the source contact structure 116 in the slots 150. The slot liner 156 may be conformally formed by conventional techniques such that a portion of the slots 150 remains open (e.g., unoccupied). In instances when the slots 150 are horizontally misaligned with the slot sacrificial structure 132 (FIG. 2D), the undercut regions 153 may be vertically adjacent to (e.g., under) portions of the tiers 125 of the preliminary tier stack 101, and portions of the slot liner 156 may be formed within the undercut regions 153. The slot liner 156 may be formed of and include one or more of dielectric material, semiconductive material, and conductive material. In some embodiments, the slot liner 156 is undoped polysilicon. In other embodiments, the slot liner 156 is configured as a nitride-oxide-nitride (NON) material, so long as the materials of the slot liner 156 exhibit etch selectivity relative to surrounding materials. The slot liner 156 may be formed to a thickness within a range of from about 20 nm to about 40 nm.

Still referring to FIG. 2E, following the formation of the slot liner 156, portions of the slot liner 156 may be removed to expose the third material 122 of the source contact structure 116. Portions of the third material 122 may then also be removed to form openings 158 (e.g., recesses) vertically extending through the third material 122. An individual opening 158 may expose a portion of the second material 120 of the source contact structure 116.

Figure 2F:
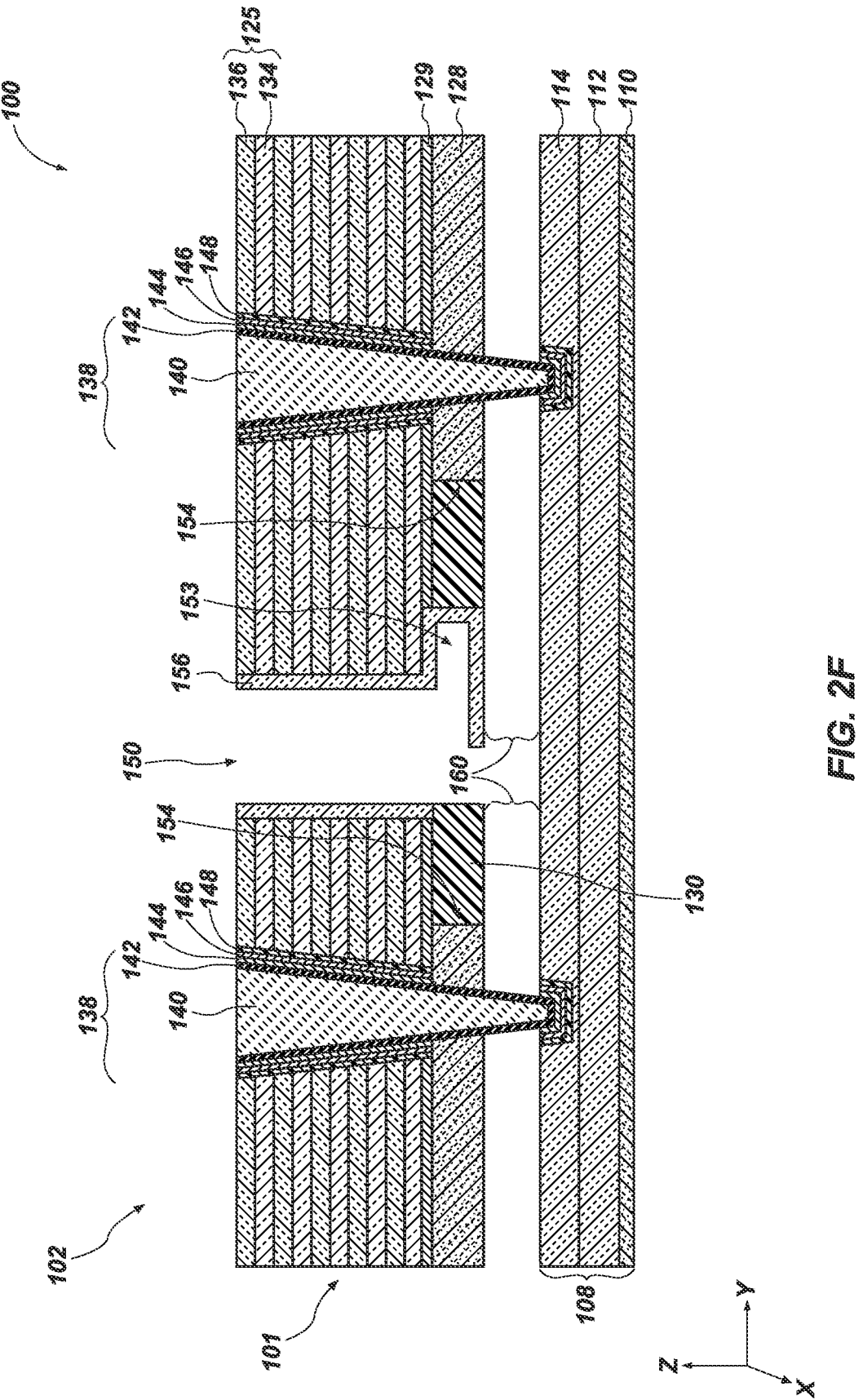

Next, referring to FIG. 2F, to provide access to the cell pillar structures 138, the source contact structure 116 and portions of the cell films (charge blocking material 148, charge trap material 146, tunnel dielectric material 144) are sequentially removed. The source contact structure 116 is removed while a majority of the cap material 128 remains intact by selecting the etch conditions used to remove the source contact structure 116. In other words, the cap material 128, including the second implant region 130, is substantially resistant to the etch conditions used to remove the source contact structure 116. In some embodiments, the cap material 128 is a carbon-doped polysilicon material, the second implant region 130 is additionally doped with boron; and silicon dioxide materials of the source contact structure 116 and the cell pillar structures 138 are selectively etchable relative to the cap material 128 and the second implant region 130.

Referring collectively to FIGS. 2E and 2F, the second material 120 (FIG. 2E) of the source contact structure 116 (FIG. 2E) is removed through the slots 150 to expose an upper surface of the first material 118 (FIG. 2E). The second material 120 of the source contact structure 116 is removed without substantially removing the first material 118, the third material 122, or the charge blocking material 148 of the cell pillar structures 138. Thereafter, portions of the third material 122 and the first material 118 of the source contact structure 116 (FIG. 2E), as well as portions of the cell films of the cell pillar structures 138, may be removed through the slots 150 to form a first source contact opening 160. For example, exposed portions of the charge blocking material 148 and the third material 122 are selectively removed without substantially removing the slot liner 156. The third material 122 may be removed while the exposed portion of the charge blocking material 148 is removed. In addition, the first material 118 may be removed while the third material 122 and the charge blocking material 148 are removed. Alternatively, the first material 118 may be removed in one or more material removal processes following removal of the third material 122, the charge blocking material 148, and one or more additional cells films (e.g., the charge trap material 146, the tunnel dielectric material 144) of the cell pillar structures 138.

Exposed portions of the charge trap material 146 may be removed without substantially removing the slot liner 156. The portion of the charge trap material 146 laterally adjacent the first source contact opening 160 is removed by selectively etching the charge trap material 146, which exposes a portion of the tunnel dielectric material 144. The exposed portion of the tunnel dielectric material 144 may then be selectively removed. Removing the tunnel dielectric material 144 exposes a portion of the channel material 142. During material removal processes through the slots 150, additional sacrificial materials (e.g., sacrificial liners) may, optionally, be formed to protect surrounding materials during respective material removal processes, which sacrificial materials may be subsequently removed through the slots 150. The exposed portion of the channel material 142 may subsequently be in contact with the source contact 126 (FIG. 1B).

Forming the first source contact opening 160 exposes the lower surface of the cap material 128, including the second implant region 130 thereof. The lower surface of the cap material 128 may be substantially coplanar with a lower surface (e.g., a lower horizontal surface) of the slot liner 156, as well as lower surfaces of each of the charge blocking material 148, the charge trap material 146, and the tunnel dielectric material 144. The cap material 128 may function as an offset between the source stack 108 and the tiers 125 of the preliminary tier stack 101 during the fabrication of the microelectronic device structure 100. In addition, forming the first source contact opening 160 exposes the upper surface of the doped semiconductive material 114. Since the first material 118, the second material 120, and the third material 122 of the source contact structure 116 (FIG. 2E) provide protection to (e.g., masking of) various materials during the process acts, the initial thicknesses of the first material 118, the second material 120, and the third material 122 are selected to be sufficiently thick to survive the etch conditions used to provide lateral access to the channel material 142 of the cell pillar structures 138.

While the first material 118, the second material 120, and the third material 122 are shown as having been removed (e.g., are not present) in FIG. 2F, these materials of the source contact structure 116 (FIG. 2E) may be present (e.g., may remain) in additional regions of the microelectronic device structure 100 (e.g., in the staircase region 104 and the intervening region 106, as described with respect to FIGS. 3A through 3C). The source contact structure 116 may also be present, for example, in peripheral regions of the microelectronic device structure 100. In other words, the source contact structure 116 may be positioned between the doped semiconductive material 114 and the cap material 128 in the additional regions of the microelectronic device structure 100. Therefore, although the source contact 126 (FIG. 1B) is present between the cap material 128 and the source stack 108 in the array region 102 of the microelectronic device structure 100, the additional regions of the microelectronic device structure 100 may include the source contact structure 116 interposed between the cap material 128 and the source stack 108.

The first source contact opening 160 may provide access (e.g., lateral access) to the cell pillar structures 138. While FIG. 2F illustrates exposed horizontal surfaces of the tunnel dielectric material 144, the charge trap material 146, and the charge blocking material 148 proximal to the cap material 128 as being substantially coplanar with one other and with the exposed horizontal surfaces of the cap material 128, the exposed horizontal surfaces of the charge trap material 146 may be recessed relative to the exposed horizontal surfaces of one or more of the tunnel dielectric material 144 and the charge blocking material 148 depending on the etch conditions used. For example, exposed horizontal surfaces of the charge trap material 146 may be located at a vertical elevation vertically offset from those of the exposed horizontal surfaces of the charge blocking material 148 and the tunnel dielectric material 144. The exposed horizontal surfaces of the tunnel dielectric material 144 may also be vertically offset from the exposed horizontal surfaces of the cap material 128 and the charge trap material 146. Therefore, the dimensions of the first source contact opening 160 may be further increased proximal to the cell pillar structures 138.

Figure 2G:
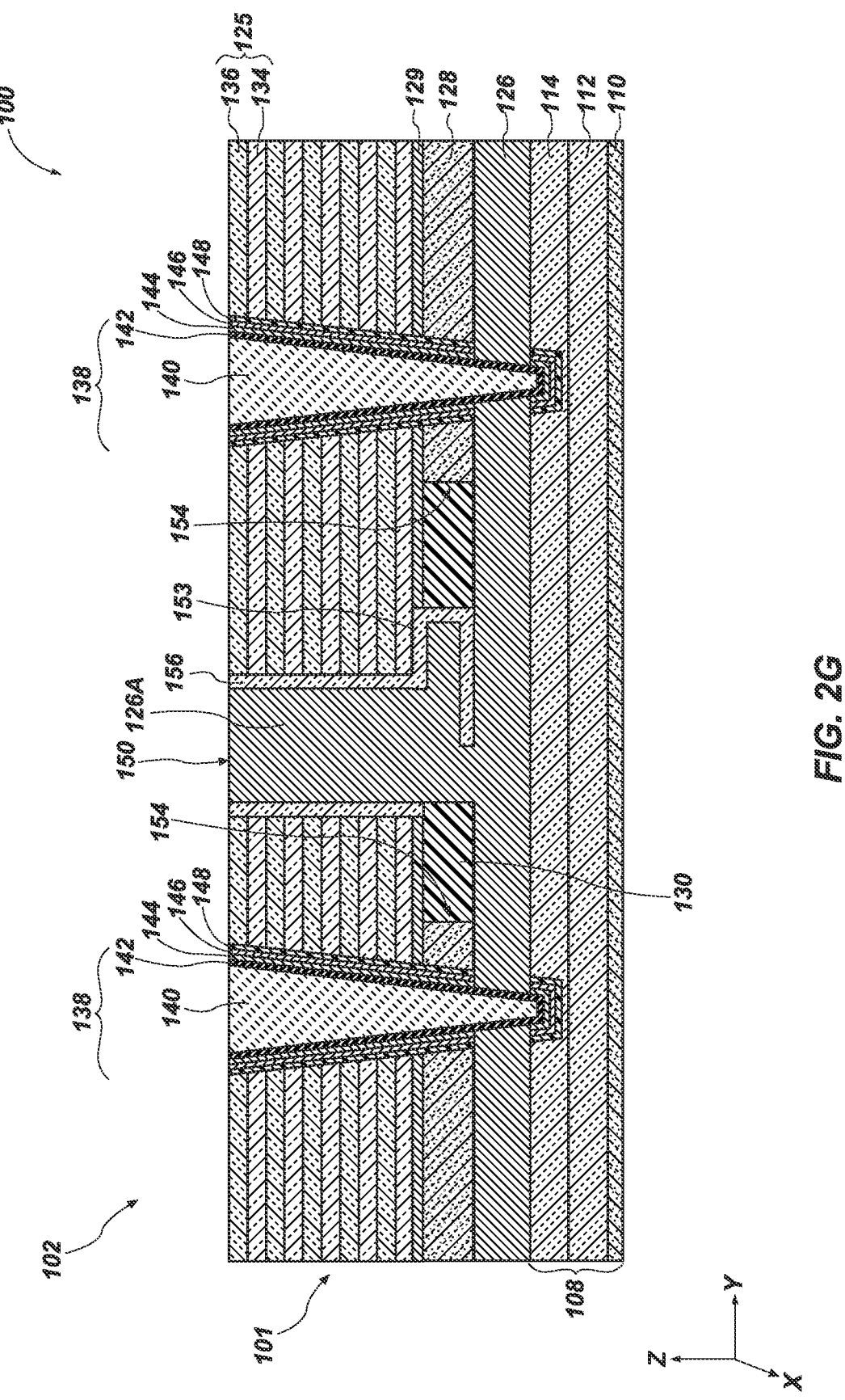

Referring to FIG. 2G, conductive material 126A of the source contact 126 is formed within the first source contact opening 160 (FIG. 2F). The conductive material 126A may substantially completely fill the first source contact opening 160 and may also fill a portion of the slots 150. In some embodiments, the conductive material 126A is formed of and includes conductively doped polysilicon, such as N+ doped polysilicon. The conductive material 126A may be formed at a thickness within a range of from about 15 nm to about 200 nm, such as from about 15 nm to about 30 nm, from about 30 nm to about 50 nm, from about 50 nm to about 80 nm, from about 80 nm to about 120 nm, from about 120 nm to about 150 nm, from about 150 nm to about 180 nm, or from about 180 nm to about 200 nm. The conductive material 126A extends to and contacts the cell pillar structures 138. An oxidation act may be conducted to activate dopants in the conductive material 126A so that the conductive material 126A is substantially continuous and includes few holes, voids, or a seam.

Figure 2H:
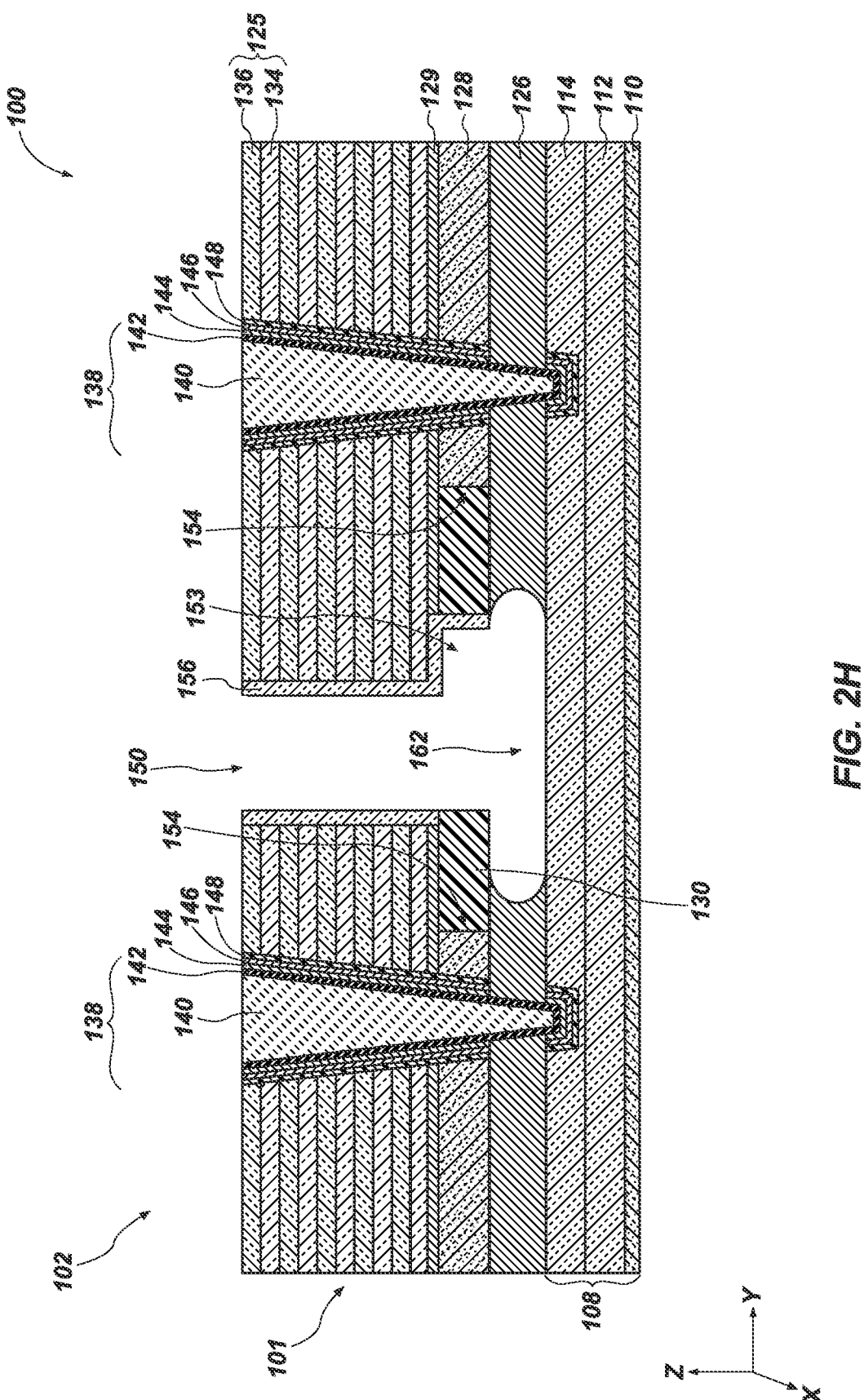

Referring to FIG. 2H, portions of the conductive material 126A (FIG. 2G) within the slots 150 are removed while retaining additional portions of the conductive material 126A within the vertical boundaries of the first source contact opening 160 (FIG. 2F) to form the source contact 126. The resulting source contact 126 extends in a horizontal direction between the cap material 128 (including the second implant region 130 thereof) and the doped semiconductive material 114, and contacts (e.g., directly physically contacts) the channel material 142, the tunnel dielectric material 144, the charge trap material 146, and the charge blocking material 148 of the cell pillar structures 138. For example, the source contact 126 directly contacts upper and lower horizontal surfaces of the tunnel dielectric material 144, the charge trap material 146, and the charge blocking material 148 and side surfaces of the channel material 142. A lower surface of the source contact 126 directly contacts the doped semiconductive material 114, and an upper surface of the source contact 126 directly contacts the cap material 128 (including the second implant region 130). Thus, the source contact 126 may include a substantially continuous portion of the conductive material 126A extending laterally adjacent to and substantially surrounding the channel material 142 of the cell pillar structures 138.

As shown in FIG. 2H, second source contact openings 162 may be formed to be integral and continuous with the slots 150 and may also horizontally extend from and between portions of the source contact 126. The second source contact openings 162 may expose a portion of the upper surface of the doped semiconductive material 114, and may also expose portions of the second implant region 130 of the cap material 128 not protected by the slot liner 156. Following formation of the second source contact openings 162, the slot liner 156 may be removed from the side surfaces of the tiers 125 of the preliminary tier stack 101 and the cap material 128.

The second implant region 130 of the cap material 128 may provide additional process margin for etching materials of the microelectronic device structure 100. By including the second implant region 130, etching into and through the source contact 126 is more controllable than conventional methodologies. The second implant region 130 of the cap material 128 protects underlying conductive materials (e.g., the doped semiconductive material 114) of the source stack 108 and mitigates etching into the source contact 126. By appropriately selecting a material composition of the second implant region 130 of the cap material 128, polysilicon materials of the microelectronic device structure 100 may be removed without undesirably removing portions of the source stack 108 vertically underlying the second implant region 130. By protecting the source stack 108, undesirable corrosion of conductive materials of the source stack 108 may be reduced or eliminated.

Figure 2I:
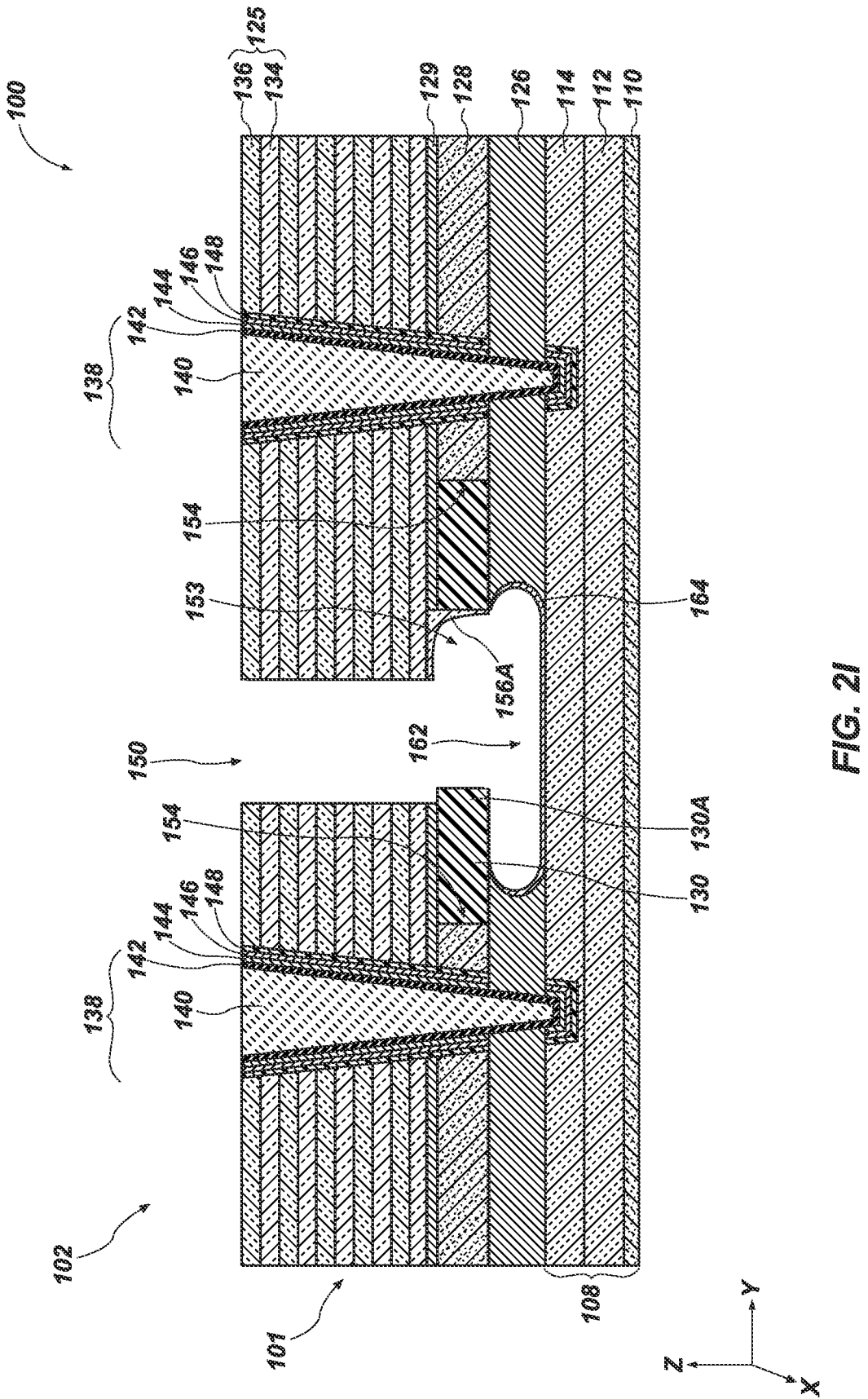

Referring to FIG. 2I, the oxidized portion 164 may, optionally, be formed within one or more of the slots 150 and the second source contact openings 162. For example, exposed portions of one or more of the cap material 128 (e.g., the second implant region 130 thereof) and the source contact 126 may be oxidized to form the oxidized portion 164. The oxidized portion 164 may be formed on side surfaces of the second implant region 130 of the cap material 128 and the source contact 126. In some embodiments, an exposed upper surface of the doped semiconductive material 114 is also oxidized to form an additional portion of the oxidized portion 164, such that the oxidized portion 164 extends along a portion of the upper surface of the doped semiconductive material 114.

For ease of understanding the disclosure, portions of a respective material (e.g., the second implant region 130 of the cap material 128, the source contact 126, the doped semiconductive material 114) that have been oxidized are collectively referred to herein as the oxidized portion 164, but it is understood that individual oxidized portions corre-spond to the respective material that has been oxidized to form the oxidized portion 164. The respective material may, therefore, exhibit a heterogeneous composition throughout its thickness, with the oxidized portion 164 including a higher concentration of oxygen atoms. The oxidized portion 164 may be formed by conventional techniques or, alterna-tively, the oxidized portion 164 may include a native oxide material formed on exposed surfaces of the respective material.

In some embodiments where the slots 150 are substan-tially horizontally aligned with the slot sacrificial structure 132 (FIG. 2C), the oxidized portion 164 extends to a bottom surface of the lowermost insulative materials 134 of the tiers 125 of the preliminary tier stack 101. In this way, the oxidized portion 164 may form a continuous liner from the bottom surface of the lowermost insulative materials 134 of the tiers 125, along the side surfaces of the second implant region 130 of the cap material 128 and the source contact 126, and along the upper surface of the doped semiconduc-tive material 114. In additional embodiments where the slots 150 are misaligned with the slot sacrificial structure 132, one or more residual portions 156A of the slot liner 156 (FIG. 2H) at least initially remain in the slots 150 upon removal of the slot liner 156. For example, the residual portions 156A of the slot liner 156 may remain within the undercut regions 153 if portions thereof are inaccessible during material removal processes. If the residual portions 156A of the slot liner 156 initially remain in the slots 150, the oxidized portion 164 may not extend to the lowermost insulative materials 134 of the tiers 125. The residual portions 156A of the slot liner 156 may or may not be subsequently removed during additional material removal processes (e.g., the replacement gate processes).

Figure 2J:
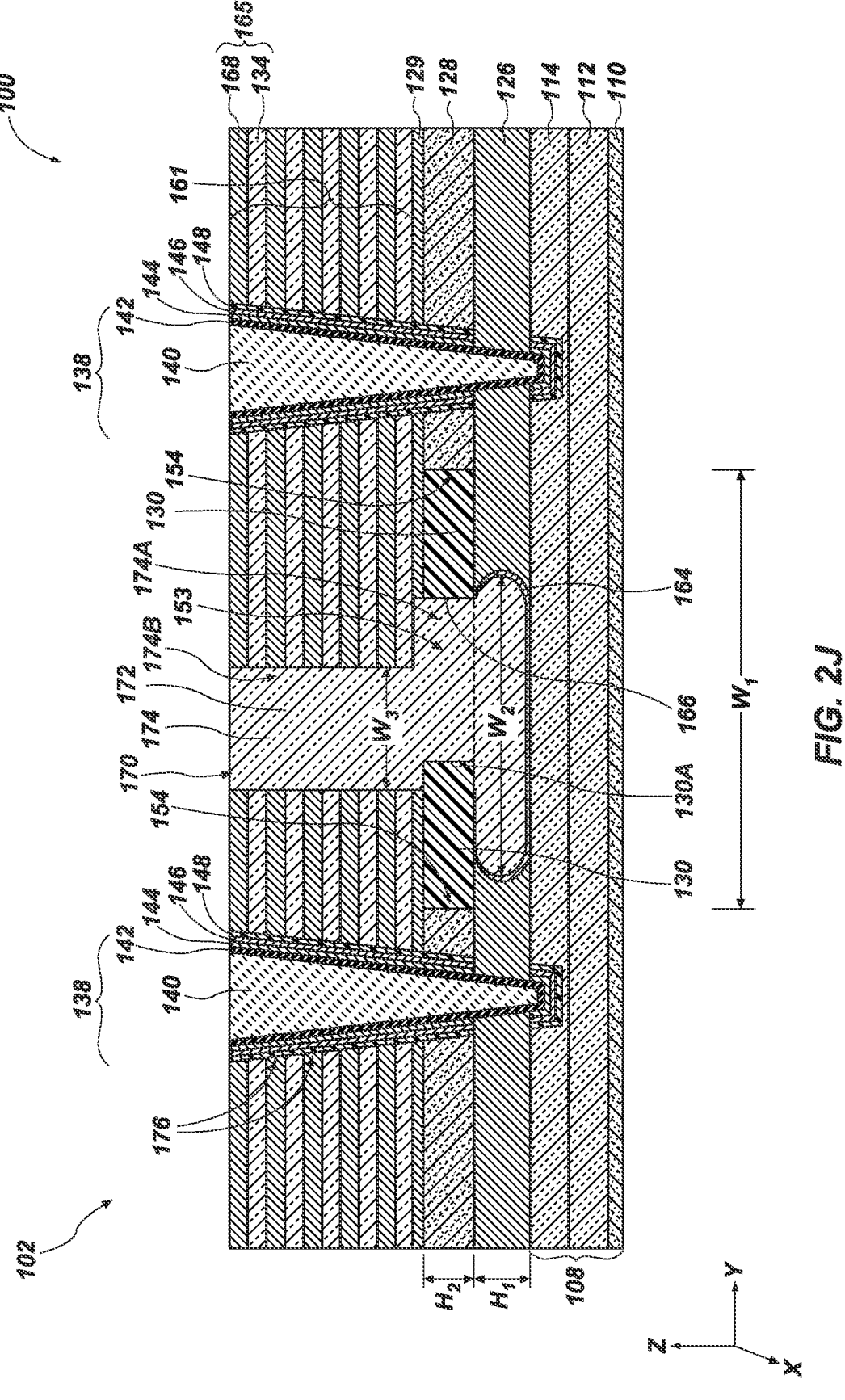

Referring next to FIG. 2J, the additional insulative mate-rial 136 (FIG. 2I) of the tiers 125 (FIG. 2I) of the preliminary tier stack 101 (FIG. 2I) may be replaced (e.g., by way of replacement gate processing) with the conductive material 168 to convert the preliminary tier stack 101 (FIG. 2I) into the tiered stack 161 (including the tiers 165 thereof) previ-ously described herein with reference to FIGS. 1A through 1C. The conductive material 168 of one or more of the tiers 165 relatively vertically proximate to the cap material 128 may be employed as the SGS structure 169. As part of replacement gate processing of the preliminary tier stack 101 (FIG. 2I), the additional insulative material 136 (FIG. 2I) of the tiers 125 (FIG. 2I) may be removed by exposing the tiers 125 (FIG. 2I) to a wet etch chemistry formulated to remove, for example, silicon nitride. The wet etchant may include, but is not limited to, one or more of phosphoric acid, sulfuric acid, hydrochloric acid, nitric acid, or a combination thereof. In some embodiments, the additional insulative material 136 (FIG. 2I) of the tiers 125 (FIG. 2I) of the preliminary tier stack 101 (FIG. 2I) are removed using a so-called "wet nitride strip" process that includes exposing the additional insulative material 136 to phosphoric acid. The residual portions 156A (FIG. 2I), if present, of the slot liner 156 (FIG. 2H) may also be removed during material removal processes. Following the removal of the additional insulative material 136, the conductive material 168 may be formed (e.g., deposited) within the resulting openings (e.g., voids).

As shown in FIG. 2J, the formation of the conductive materials 168 may form vertically extending strings of the memory cells 176, with individual memory cells 176 located at intersections of the cell pillar structures 138 and the conductive materials 168 of the tiers 165 of the tiered stack 161. The conductive material 168 of the tiers 165 may serve as gate structures for access devices of the memory cells 176.

Still referring to FIG. 2J, following the formation of the tiered stack 161, the fill material 172 may be formed in the slots 150 (FIG. 2I) and the second source contact openings 162 (FIG. 2I) to form the slot structures 170, previously described herein. The fill material 172 may be in direct contact with exposed surfaces of the tiers 165 of the tiered stack 161, the dielectric cap material 129 (if present), the source contact 126, and the second implant region 130 of the cap material 128. The fill material 172 may not be in direct contact with additional, non-implanted regions of the cap material 128. The fill material 172 may be adjacent to the oxidized portion 164 (if present) of the second implant region 130 of the cap material 128, the source contact 126, and the doped semiconductive material 114 of the source stack 108.

As shown in FIG. 2J, the second implant region 130 of the cap material 128 may exhibit a first width $W_1$ in the second horizontal direction (e.g., the Y-direction) that is substan-tially orthogonal to the first horizontal direction (e.g., the X-direction) in which the slot structure 170 extends. By way of non-limiting example, the first width $W_1$ of the second implant region 130 of the cap material 128, may be within a range of from about 200 nm to about 1000 nm (e.g., 1 μm), such as from about 200 nm to about 400 nm, from about 400 nm to about 600 nm, from about 600 nm to about 800 nm, or from about 800 nm to about 1000 nm. By way of non-limiting example, segmented portions of the second implant region 130 of the cap material 128 on opposing sides of the slot structure 170 may individually have a horizontal width within a range of from about 30 nm to about 200 nm, such as from about 30 nm to about 80 nm, from about 80 nm to about 120 nm, from about 120 nm to about 160 nm, or from about 160 nm to about 200 nm.

The fill material 172 of the slot structure 170 exhibits different widths in the second horizontal direction, with a lower portion of the fill material 172 exhibiting one or more different widths than an upper portion thereof. As the lower portion of the slots 150 (FIG. 2I), corresponding to the slot sacrificial structure 132 (FIG. 2C), and the second source contact openings 162 (FIG. 2I) are filled with the fill material 172, the fill material 172 exhibits different widths in the lower portion than in the upper portion (e.g., laterally adjacent the tiers 165 of the tiered stack 161). For example, a second width $W_2$ of the fill material 172 laterally adjacent the source contact 126 may be relatively greater than a third width $W_3$ of the fill material 172 laterally adjacent the tiers 165 of the tiered stack 161. In addition, the second width $W_2$ of the fill material 172 laterally adjacent to the source contact 126 may be relatively less than the first width $W_1$ of the second implant region 130 of the cap material 128. In some embodiments, the first width $W_1$ of the second implant region 130 of the cap material 128 is relatively greater than each of the second width $W_2$ of the fill material 172 and the third width $W_3$ of the fill material 172. The differing widths of the fill material 172 may be present in the regions of the microelectronic device structure 100, such as in the array region 102, the staircase region 104 (FIG. 1B), and the intervening region 106 (FIG. 1B) of the microelectronic device structure 100.

As shown in FIG. 2J, the source contact 126 may exhibit a first height $H_1$, and the cap material 128, including the second implant region 130 thereof, may exhibit a second height $H_2$ that is relatively less than the first height $H_1$ of the source contact 126. The first height $H_1$ of the source contact 126 is greater than or equal to a combined thickness of the materials of the as-formed source contact structure 116 (FIG. 1B). By determining the desired thickness of the source contact 126, the thickness of the source contact structure 116 may be selected. Accordingly, the first height $H_1$ corresponds to the vertical thickness of the source contact 126 and is relatively greater than the second height $H_2$ of the cap material 128. In additional embodiments, the first height $H_1$ of the source contact 126 and the second height $H_2$ of the cap material 128 are substantially equal to one another. However, the disclosure is not so limited, and additional configurations may be contemplated. For example, the second height $H_2$ of the cap material 128 may be relatively greater than the first height $H_1$ of the source contact 126. The first height $H_1$ of the source contact 126, may be within a range of from about 15 nm to about 200 nm, such as from about 15 nm to about 40 nm, from about 40 nm to about 80 nm, from about 80 nm to about 120 nm, from about 120 nm to about 160 nm, or from about 160 nm to about 200 nm. The second height $H_2$ of the cap material 128, may be within a range of from about 20 nm to about 100 nm, such as from about 20 nm to about 40 nm, from about 40 nm to about 60 nm, from about 60 nm to about 80 nm, or from about 80 nm to about 100 nm.

By forming the second implant region 130 of the cap material 128 horizontally adjacent the slots 150, elongated portions of the second implant region 130 may directly contact the fill material 172 of the slot structure 170 on opposing sides thereof (e.g., proximal the undercut regions 153). The second implant region 130 of the cap material 128 may mitigate corrosion of conductive materials (e.g., the doped semiconductive material 114) of the source stack 108 during formation and removal of additional conductive materials. The presence of the second implant region 130 of the cap material 128 horizontally adjacent the fill material 172 may also reduce damage of surrounding materials upon removal of the residual portions 156A (FIG. 2I) of the slot liner 156 (FIG. 2H), to mitigate occurrences of corner attack by providing the etch-resistant material of the second implant region 130 along the interface 166 between the second implant region 130 and the fill material 172. Moreover, presence of the second implant region 130 of the cap material 128 vertically adjacent the tiers 165 of the tiered stack 161 may reduce damage of surrounding materials (e.g., the insulative materials 134) of the tiers 165 during removal of the additional insulative materials 136 (FIG. 2I).

As discussed above, FIGS. 3A through 3C illustrate formation of portions of the microelectronic device structure 100 within the staircase region 104 of the microelectronic device structure 100. The portions of the microelectronic device structure 100 within the staircase region 104 may be formed during (e.g., substantially simultaneous with) formation of additional portions of the microelectronic device structure 100 within the array region 102 previously described with reference to FIGS. 2A through 2J and during formation of the intervening region 106 (FIG. 1B). FIG. 3A is a simplified, partial cross-sectional view of the staircase region 104 of the microelectronic device structure 100 at the processing stage of FIG. 2B. Portions of the microelectronic device structure 100 within the staircase region 104 include the source stack 108 (including the conductive material 110, the source material 112, and the doped semiconductive material 114), the source contact structure 116 (including the first material 118, the second material 120, and the third material 122), the cap material 128 (including the second implant region 130 thereof), the dielectric cap material 129, and the slot sacrificial structure 132 (including the liner material 132A and the etch stop material 132B thereof).

As shown in FIG. 3A, within the staircase region 104, the slot sacrificial structure 132 may be formed to extend through the dielectric cap material 129 and the cap material 128. The second implant region 130 of the cap material 128 within the staircase region 104 may be formed during (e.g., substantially simultaneous with) formation of the second implant region 130 within the array region 102 (FIG. 2B). In the staircase region 104, however, the first implant region 124 of the source contact structure 116 may be formed within the second material 120 thereof and prior to formation of the third material 122 of the source contact structure 116, the cap material 128, the dielectric cap material 129, and the slot sacrificial structure 132. In other words, the first implant region 124 may be formed within remaining portions of the source contact structure 116 within the staircase region 104 prior to formation of the second implant region 130 within the cap material 128.

To form the first implant region 124 of the source contact structure 116, the second material 120 of the source contact structure 116 may be patterned prior to formation of the third material 122 thereof. A patterned hardmask may be used to form the first implant region 124 at a desired location and at desired dimensions within the source contact structure 116. The first implant region 124 of the source contact structure 116 may be formulated to exhibit an etch rate that is substantially different than (e.g., substantially less than) an etch rate of other regions of the source contact structure 116, as well as the doped semiconductive material 114 and exposed polysilicon materials in the microelectronic device structure 100 when exposed to the same etch conditions. The first implant region 124 of the source contact structure 116 may, for example, be resistant to a tetramethylammonium hydroxide (TMAH)-based chemistry or other etch chemistries (e.g., phosphoric acid-based etch chemistries, ammonium hydroxide, hydrogen fluoride (HF), or other halogen-based etch chemistries) formulated to selectively remove polysilicon-based materials. By way of non-limiting example, the first implant region 124 of the source contact structure 116 may be formed by implanting at least one dopant species into the source contact structure 116.

The first implant region 124 of the source contact structure 116 may be configured and formulated to protect conductive materials (e.g., the doped semiconductive material 114) of the source stack 108 during removal processes described herein. In particular, by forming the first implant region 124 of the source contact structure 116, the doped semiconductive material 114 may be protected from being removed (e.g., exhumed) while sacrificial structures (e.g., polysilicon materials) are removed during subsequent formation of the slots 150 (FIG. 1A) and during subsequent replacement gate processes to form the tiered stack 161 (FIG. 1A). Accordingly, the first implant region 124 of the source contact structure 116 may assist in maintaining the structure of the doped semiconductive material 114 by slowing (e.g., terminating) vertical progression of etchant chemistry to mitigate exposure of underlying materials. By slowing vertical etch of exposed polysilicon, corrosion and/or overetch of the doped semiconductive material 114 and the source material 112 may be reduced or eliminated.

The dopant species included in the first implant region 124 of the source contact structure 116 may provide the first implant region 124 etch selectivity relative to other regions of the source contact structure 116, as well as the doped semiconductive material 114, and other exposed materials. By way of example only, portions of the source contact structure 116 (e.g., the second material 120 thereof) may be implanted with boron, carbon, oxygen, nitrogen, gallium, or a combination thereof to form the first implant region 124. The implant conditions and the dopant species concentration may be tailored to achieve the desired etch selectivity of the source contact structure 116 and other exposed materials relative to the first implant region 124. By way of non-limiting example, the dopant species may be provided within the second material 120 of the source contact structure 116 to a total concentration within a range of from about $1\times10^{18}$ atoms/cm$^3$ to about $1\times10^{22}$ atoms/cm$^3$, such as within a range of from about $1\times10^{20}$ atoms/cm$^3$ to about $1\times10^{22}$ atoms/cm$^3$. In some embodiments, the first implant region 124 of the source contact structure 116 comprises boron-doped polysilicon material and/or carbon-doped polysilicon material. The dopant species implant conditions and dimensions of the patterned hardmask on or over the source contact structure 116 are used to control the distribution of the dopant in the source contact structure 116, forming the first implant region 124 of the source contact structure 116. The dopant species may be implanted to a desired depth through the source contact structure 116, such as extending substantially through the second material 120 of the source contact structure 116 and to a lower surface thereof adjacent to the first material 118. In additional embodiments, the dopant species is implanted to a desired depth that is less than the vertical extent of the source contact structure 116, such that the first implant region 124 extends through an upper portion of the second material 120 of the source contact structure 116, without substantially extending through a lower portion thereof. In some embodiments, a material composition of the first implant region 124 of the source contact structure 116 is substantially the same as a material composition of the second implant region 130 of the cap material 128.

Following formation of the first implant region 124 within the source contact structure 116, the second implant region 130 may be formed within the cap material 128 overlying the source contact structure 116. The second implant region 130 may be formed at an elevational level above (e.g., vertically elevated relative to) the source contact structure 116 and within horizontal boundaries of the first implant region 124. For example, a horizontal area and horizontal shape of the second implant region 130 of the cap material 128 may be substantially the same as a horizontal area and horizontal shape of the first implant region 124 of the source contact structure 116. Lateral boundaries (e.g., in the Y-direction) of the first implant region 124 of the source contact structure 116 and the second implant region 130 of the cap material 128 may be substantially vertically aligned (e.g., substantially coplanar) with one another. However, the disclosure is not so limited, and additional configurations may be contemplated. For example, lateral boundaries of the first implant region 124 of the source contact structure 116 may be horizontally offset (e.g., in the Y-direction) from lateral boundaries of the second implant region 130 of the cap material 128. Following formation of the second implant region 130 within the cap material 128, additional materials and structures (e.g., the dielectric cap materials 129, the slot sacrificial structure 132, including the liner material 132A and the etch stop material 132B thereof) may be formed thereover, as shown in FIG. 3A. Thereafter, excess portions of the slot sacrificial structure 132 may be removed (e.g., through a CMP process).

Referring to FIG. 3B, the tiers 125 of the alternating insulative materials 134 and additional insulative materials 136 of the preliminary tier stack 101 are formed on or over the slot sacrificial structure 132 (including the liner material 132A and the etch stop material 132B thereof) and the cap material 128 (including the second implant region 130 thereof). If present, the dielectric cap materials 129 may vertically intervene between the tiers 125 and the cap material 128. A portion of the tiers 125 of the preliminary tier stack 101 and the slot sacrificial structure 132 may be removed to form the slots 150 through the tiers 125 and the lower openings 152 in the cap material 128, exposing the source contact structure 116, resulting in the microelectronic device structure 100 at the processing stage depicted in FIG. 2D. The portion 130A of the second implant region 130 of the cap material 128 may extend into the slots 150, such as when the slots 150 are misaligned with the horizontal center of the second implant region 130 of the cap material 128. The cap material 128 not including the second implant region 130 of the cap material 128 may terminate in the Y-direction on opposing sides of the slots 150 at the lateral boundaries 154 that are spaced apart from the slots 150. Since the source contact structure 116 remains within the staircase region 104, the first implant region 124 thereof is in vertical alignment (e.g., under) the respective slots 150. Similar configurations may be present within the intervening region 106 (FIG. 1B). For example, the first implant region 124 of the source contact structure 116 may be horizontally aligned with the slots 150 within horizontal boundaries of one or more (e.g., both) of the staircase region 104 and the intervening region 106.

Referring to FIG. 3C, the replacement gate process is conducted to remove the additional insulative materials 136 (FIG. 3B) of the tiers 125 (FIG. 3B) and to form the conductive materials 168 of the tiers 165 of the tiered stack 161, resulting in the microelectronic device structure 100 at the processing stage previously described with reference to FIG. 2J. The fill material 172 may be formed in the slots 150 (FIG. 3B) to form the slot structures 170, which include the dielectric structure 174 (including the lower portion 174A and the upper portion 174B thereof). The fill material 172 may be in direct contact with exposed surfaces of the tiers 165 of the tiered stack 161, the dielectric cap material 129 (if present), and the second implant region 130 of the cap material 128. The fill material 172 may not be in direct contact with additional, non-implanted regions of the cap material 128. The fill material 172 may directly contact the side surfaces of the second implant region 130 of the cap material 128 along the interface 166. The fill material 172 may be formed on the third material 122 of the source contact structure 116.

In some embodiments, the portion 130A of the second implant region 130 of the cap material 128 vertically overlaps a portion of the fill material 172, without vertically overlapping alternating insulative materials 134 and the conductive materials 168 of the tiers 165 of the tiered stack 161. Portions (e.g., lateral end portions of the lower portion 174A) of the dielectric structure 174 extend laterally below the tiered stack 161 such that a portion of the fill material 172 directly underlies the tiered stack 161 proximal the undercut regions 153.

As shown in FIG. 3C, within the staircase region 104, the second implant region 130 of the cap material 128 exhibits the first width $W_1$ in the Y-direction. Similarly, the first implant region 124 of the source contact structure 116 exhibits the first width $W_1$. As in the array region 102 (FIG. 2J), the fill material 172 of the slot structure 170 within the staircase region 104 exhibits different widths in the second horizontal direction, with a lower portion of the fill material 172 exhibiting one or more different widths than an upper portion thereof. The first width $W_1$ of the second implant region 130 and, hence, the first implant region 124, may be relatively greater than the third width $W_3$ of the fill material 172 laterally adjacent the tiers 165 of the tiered stack 161. The first height $H_1$ corresponds to the thickness of the source contact structure 116 and is relatively greater than the second height $H_2$ of the cap material 128, although other configurations are contemplated, as described in greater detail above with reference to FIG. 2J. In addition, the second material 120 of the source contact structure 116, including the first implant region 124 thereof, exhibits a third height $H_3$, that is relatively less than the first height $H_1$ of the source contact structure 116 and the second height $H_2$ of the cap material 128. By way of non-limiting example, the third height $H_3$ of the second material 120 of the source contact structure 116, may be within a range of from about 20 nm to about 60 nm, such as from about 20 nm to about 25 nm, from about 25 nm to about 30 nm, from about 30 nm to about 35 nm, from about 35 nm to about 40 nm, from about 40 nm to about 45 nm, from about 45 nm to about 50 nm, from about 50 nm to about 55 nm, or from about 55 nm to about 60 nm.

Within the staircase region 104, by forming the second implant region 130 of the cap material 128 horizontally adjacent to the slots 150, elongated portions of the second implant region 130 of the cap material 128 may directly contact the fill material 172 of the slot structure 170 on opposing sides thereof (e.g., proximal the undercut regions 153). The second implant region 130 of the cap material 128 may mitigate corrosion of conductive materials (e.g., the doped semiconductive material 114) of the source stack 108 during formation and removal of additional conductive materials. Presence of the second implant region 130 of the cap material 128 horizontally adjacent to the fill material 172 may also mitigate damage to surrounding materials upon removal of the residual portions 156A (FIG. 2I) of the slot liner 156 (FIG. 2H) to circumvent occurrences of corner attack. Moreover, presence of the first implant region 124 of the source contact structure 116 vertically adjacent the second implant region 130 of the cap material 128 may further mitigate the risk of damage to surrounding materials (e.g., the doped semiconductive material 114 of the source stack 108) during material removal processes by providing the etch-resistant material of the first implant region 124 of the source contact structure 116 under the second implant region 130 of the cap material 128 and the slot structure 170.

Figure 4A:
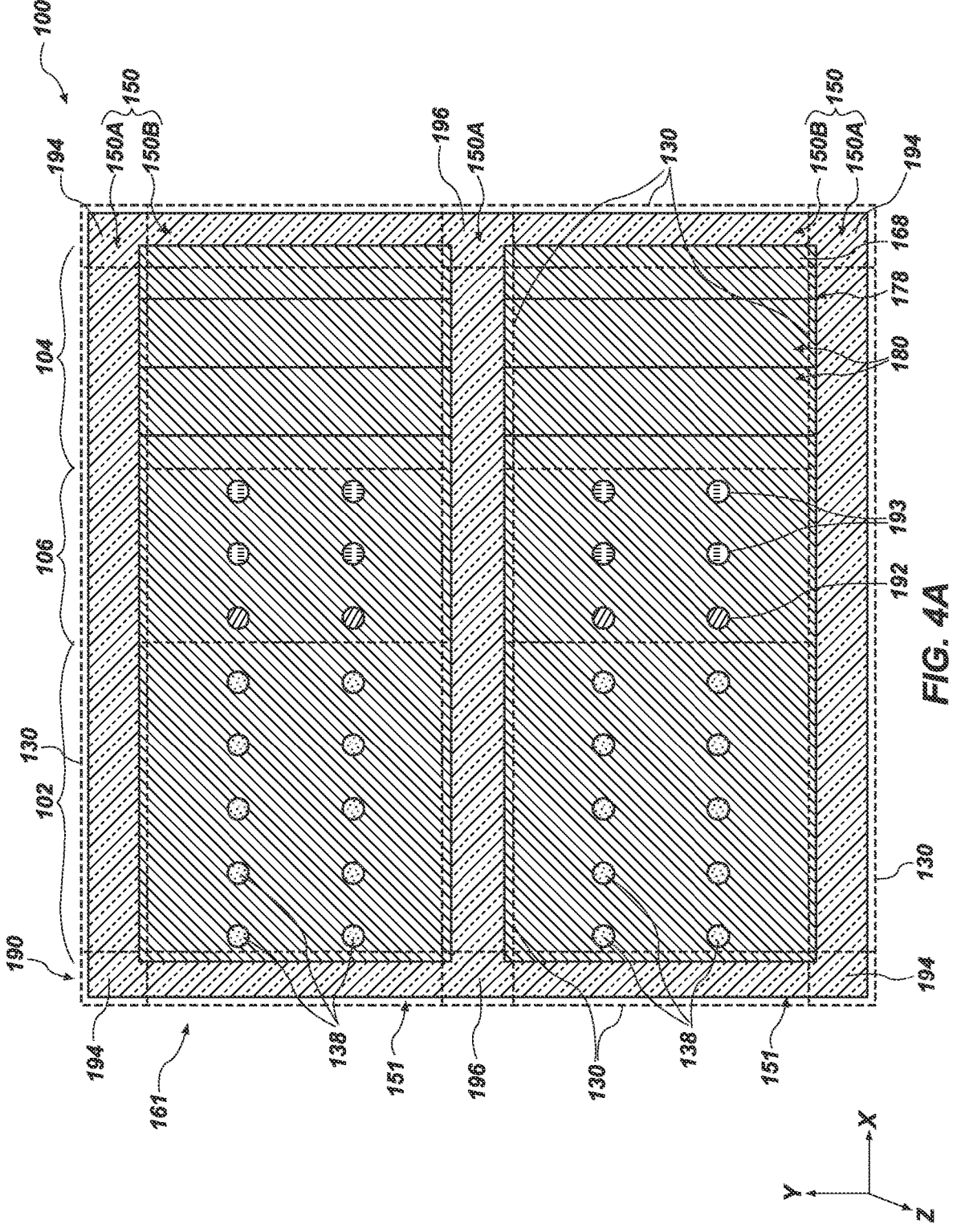
Figure 4B:
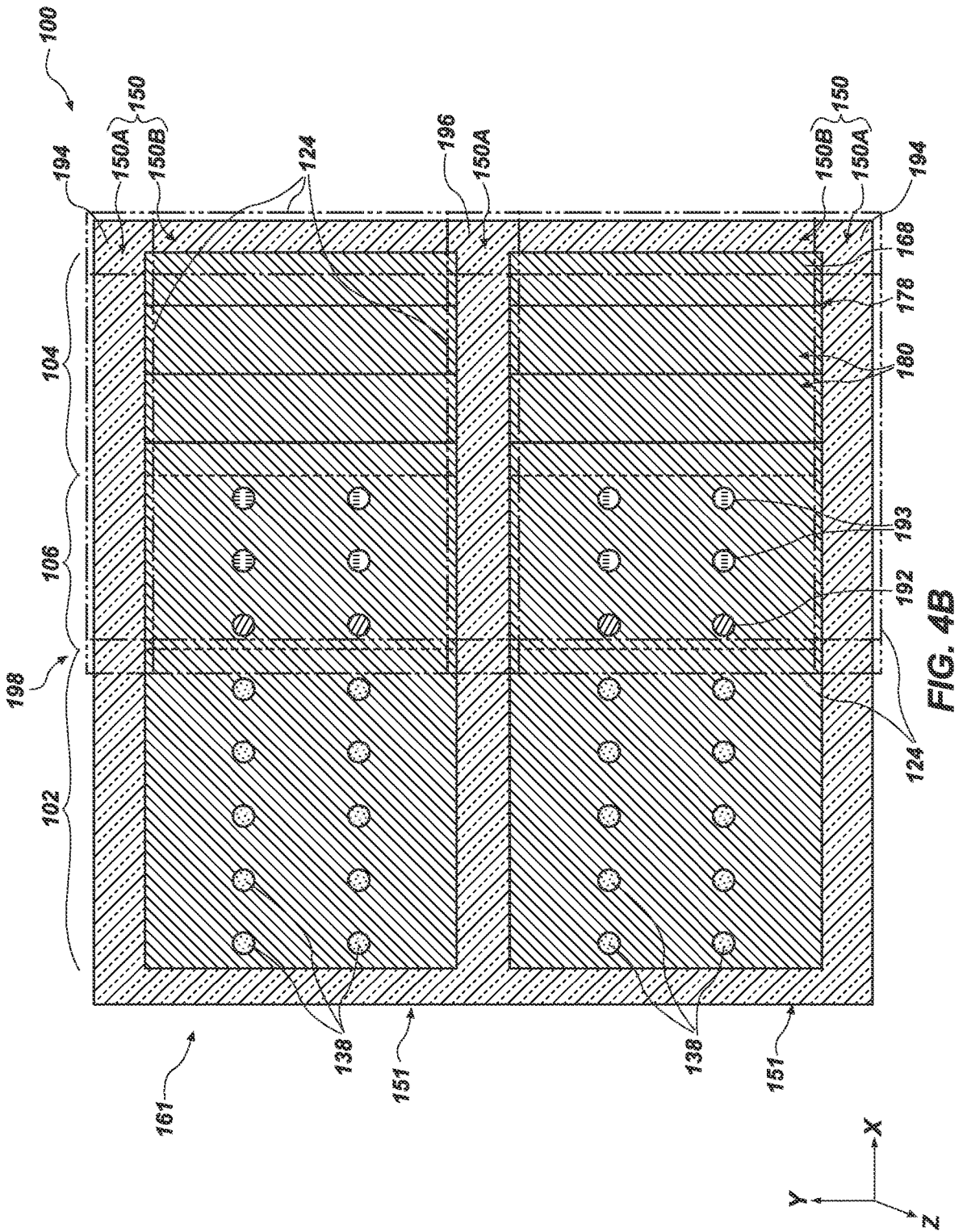
Figure 5:
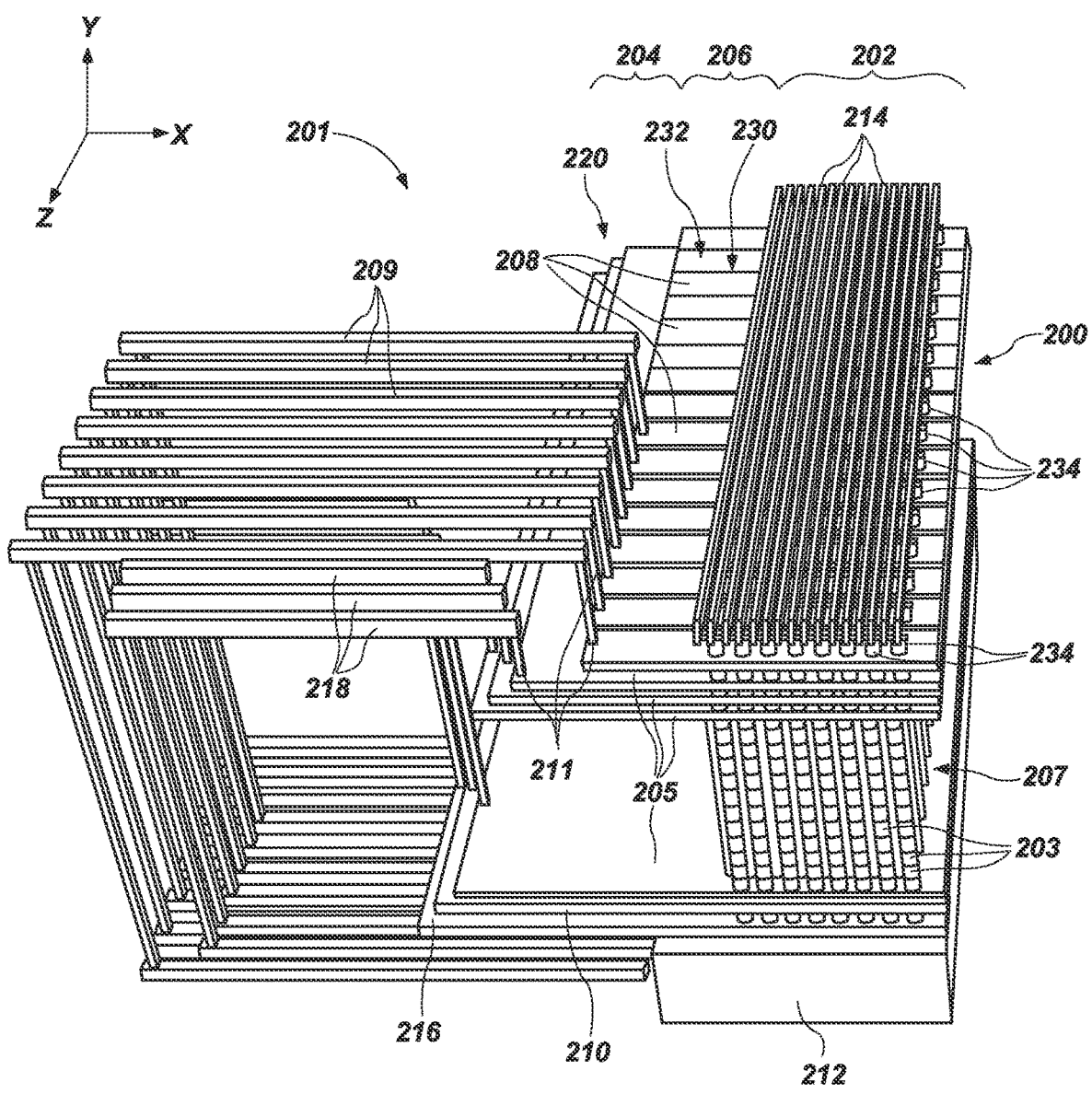
FIG. 5 is a simplified, partial cutaway perspective view of a microelectronic device, in accordance with embodiments of the disclosure.

FIGS. 4A and 4B are simplified, partial top-down views of the microelectronic device structure 100 illustrated in FIG. 1A. As shown in FIG. 4A, the second implant regions 130 of the cap material 128 (FIG. 1B) (illustrated by way of dashed lines given the lower vertical elevation of the material within the microelectronic device structure 100) may be formed to horizontally extend, for example, through each of the array region 102, the staircase region 104, and the intervening region 106 of the microelectronic device structure 100. As shown in FIG. 4B, the first implant region 124 of the source contact structure 116 (FIG. 1B) (illustrated by way of dashed lines given the lower vertical elevation of the material within the microelectronic device structure 100) may horizontally extend, for example, through the staircase region 104 and the intervening region 106.

Referring to FIG. 4A, the second implant regions 130 of the cap material 128 are adjacent to (e.g., horizontally adjacent to, laterally adjacent to) the slots 150 (e.g., filled slots, filled slot structures) within one or more of the array region 102, the staircase region 104, and the intervening region 106 of the microelectronic device structure 100. For example, the second implant regions 130 of the cap material 128 are adjacent to the first slots 150A horizontally extending in the X-direction and to the second slots 150B horizontally extending in the Y-direction. At the processing stage depicted in FIGS. 1A through 1D, 2J, 3C, 4A, and 4B, the slots 150 include the fill material 172 (FIG. 2J) of the slot structure 170 (FIG. 2J). In some embodiments, the second implant regions 130 of the cap material 128 horizontally extend through each of the array region 102, the staircase region 104, and the intervening region 106, as shown in FIG. 4A. In other embodiments, the second implant regions 130 of the cap material 128 horizontally extend within the array region 102, without horizontally extending within the staircase region 104 and the intervening region 106. For clarity and ease of understanding the drawings and associated description, the first implant region 124 of the source contact structure 116 is not shown in FIG. 4A.

Within the array region 102, the slots 150 may be formed to extend within one or more regions 190 (e.g., end of array regions). Since the second implant regions 130 of the cap material 128 are adjacent to the slots 150, the second implant regions 130 of the cap material 128 may be formed to extend within the regions 190 of the array region 102. The first slots 150A may horizontally intersect the second slots 150B at one or more intersections. For example, one of the first slots 150A may horizontally intersect one of the second slots 150B at one or more of L-intersections 194 and T-intersections 196. Since the second implant regions 130 of the cap material 128 are adjacent to the slots 150, the second implant regions 130 of the cap material 128 may be at or proximate one or more of the L-intersections 194 and the T-intersections 196, as shown in FIG. 4A.

Referring to FIG. 4B, the first implant region 124 of the source contact structure 116 is adjacent to (e.g., vertically adjacent to, under) the slots 150 within the staircase region 104 and, optionally, within the intervening region 106 of the microelectronic device structure 100. For example, the first implant region 124 of the source contact structure 116 may be adjacent to the first slots 150A horizontally extending in the X-direction and to the second slots 150B horizontally extending in the Y-direction. In some embodiments, the first implant region 124 of the source contact structure 116 horizontally extends within each of the staircase region 104 and the intervening region 106, without horizontally extending within the array region 102. In other embodiments, the first implant region 124 of the source contact structure 116 horizontally extends within a portion of the array region 102 proximal the intervening region 106. For clarity and ease of understanding the drawings and associated description, the second implant regions 130 of the source contact structure 116 are not shown in FIG. 4B.

Within the staircase region 104, the first slots 150A may horizontally intersect the second slots 150B at one or more intersections, including the L-intersections 194 and the T-intersections 196. Since the first implant region 124 of the source contact structure 116 is adjacent to the slots 150, the first implant region 124 of the source contact structure 116 may be within one or more of the L-intersections 194 and the T-intersections 196, as shown in FIG. 4B.

Additionally, or alternatively, the microelectronic device structure 100 may include additional regions (e.g., one or more barrier regions 198) of the first implant region 124 of the source contact structure 116 proximate interfaces between horizontally boundaries of the different horizontal regions. At least portions of the first implant region 124 of the source contact structure 116 may be formed in regions that are remote from the slots 150. For example, the one or more barrier regions 198 may be formed proximate an interface between the array region 102 and the staircase region 104. Portions of the barrier regions 198 may intersect the slots 150, without extending along an entirety of the slots 150. In other words, at least portions of the barrier regions 198 are separated from (e.g., isolated from) the slots 150. The barrier regions 198 may be formed to extend substantially parallel to the slots 150 (e.g., the second slots 150B). Formation of the barrier regions 198 may further protect surrounding materials and structures (e.g., the dummy structures 192, the deep contact structures 193). Such a configuration may reduce or substantially prevent the risk of undesirable current leakage and short circuits between such structures during use and operation of the microelectronic device structure 100.

The presence of the first implant region 124 of the source contact structure 116 and the second implant regions 130 of the cap material 128 of the microelectronic device structure 100 may impede or prevent undesirable damage (e.g., tier collapse, tier cracking, tier lifting) and/or undesirable deformations (e.g., tier bending, tier warping, tier bowing) to the preliminary tier stack 101 (FIGS. 2I and 3B) that may otherwise occur during the processing stages previously described with respect to FIGS. 2A and 3A. For example, forming the first implant region 124 within the staircase region 104 and the intervening region 106 and forming the second implant region 130 within the array region 102, the staircase region 104, and the intervening region 106 may circumvent removal of conductive materials that may otherwise occur during material removal processes and that may impart stresses effectuating undesirable damage to and/or undesirable deformations of portions of the tiers 125 (FIGS. 2I and 3B) of the preliminary tier stack 101 within the respective regions of the microelectronic device structure 100.

Thus, in accordance with embodiments of the disclosure, a method of forming a microelectronic device comprises forming a sacrificial material over a source structure, forming a cap material over the sacrificial material, forming implant regions within the cap material, and forming a stack structure over the cap material. The stack structure comprises a vertically alternating sequence of insulative material and additional sacrificial material arranged in tiers. The method comprises forming pillars vertically extending through the stack structure and into the source structure. The pillars individually comprising semiconductive channel material. The method comprises forming slots vertically extending through the stack structure and the implant regions of the cap material, and replacing the sacrificial material and the additional sacrificial material with conductive material after forming the slots to respectively form lateral contact structures and conductive structures.

Furthermore, in accordance with embodiments of the disclosure, a microelectronic device comprises lateral contact structures overlying a source structure and comprising conductive material, a cap material overlying the lateral contact structures and comprising implant regions therein, a stack structure overlying the cap material and comprising a vertically alternating sequence of insulative structures and conductive structures arranged in tiers, and pillars vertically extending through the stack structure and into the source structure. The pillars individually comprise semiconductive channel material in physical contact with the lateral contact structures. The microelectronic device comprises filled slot structures vertically extending at least through the stack structure and the cap material. The filled slot structures are positioned within horizontal areas of the implant regions of the cap material.

FIG. 5 illustrates a partial cutaway perspective view of a portion of a microelectronic device 201 (e.g., a memory device, such as a 3D NAND Flash memory device) including a microelectronic device structure 200. The microelectronic device structure 200 may be substantially similar to the microelectronic device structure 100 previously described with reference to FIGS. 1A through 1D, 2J, 3C, and 4A, and 4B. As shown in FIG. 5, the microelectronic device structure 200 may include a staircase structure 220 (e.g., corresponding to the staircase structure 178 (FIG. 1B)) within a staircase region 204 (e.g., corresponding to the staircase region 104 (FIG. 1B)). The staircase structure 220 may define contact regions for connecting access lines 218 to conductive structures 205 (e.g., corresponding to the conductive materials 168 (FIG. 2J)). The microelectronic device structure 200 may include vertical strings 207 of memory cells 203 (e.g., corresponding to the memory cells 176 (FIG. 2J)) within a memory array region 202 (e.g., corresponding to the array region 102 (FIG. 1B)) that are coupled to each other in series. An intervening region 206 (e.g., corresponding to the intervening region 106 (FIG. 1B)) may be horizontally interposed (e.g., in the X-direction) between the memory array region 202 and the staircase region 204. The vertical strings 207 may extend vertically (e.g., in the Z-direction) and orthogonally to conductive lines and the conductive structures 205, such as data lines 214, a source tier 216 (e.g., corresponding to the source stack 108 (FIG. 2J)), the conductive structures 205, the access lines 218, first select gates 208 (e.g., upper select gates, drain select gates (SGDs)), select lines 209, and a second select gate 210 (e.g., a lower select gate, a source select gate (SGS), such as the SGS structure 169 (FIG. 2J)). The select gates 208 may be horizontally divided (e.g., in the Y-direction) into multiple blocks 232 (e.g., corresponding to the blocks 151 (FIG. 1A)) horizontally separated (e.g., in the Y-direction) from one another by filled slots 230 (e.g., corresponding to the filled slot structures 170 (FIGS. 1C, 2J, 3C)) formed within replacement gate slots and dielectric materials of additional slots.

Vertical conductive contacts 211 may electrically couple components to each other as shown. For example, the select lines 209 may be electrically coupled to the first select gates 208 and the access lines 218 may be electrically coupled to the conductive structures 205. The microelectronic device structure 200 may also include a control unit 212 positioned under the memory array, which may include at least one of string driver circuitry, pass gates, circuitry for selecting gates, circuitry for selecting conductive lines (e.g., the data lines 214, the access lines 218), circuitry for amplifying signals, and circuitry for sensing signals. The control unit 212 may be electrically coupled to the data lines 214, the source tier 216, the access lines 218, the first select gates 208, and the second select gates 210, for example. In some embodiments, the control unit 212 includes complementary metal-oxide-semiconductor (CMOS) circuitry. In such embodiments, the control unit 212 may be characterized as having a "CMOS under Array" ("CuA") configuration. In addition, as shown in FIG. 5, at least a portion of the control unit 212 is positioned within horizontal boundaries of the memory array region 202 of the microelectronic device 201.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 214 (e.g., digit lines, bit lines) may extend horizontally in a second direction (e.g., in the Y-direction) that is at an angle (e.g., perpendicular) to the first direction in which the first select gates 208 extend. Individual data lines 214 may be coupled to individual groups of the vertical strings 207 extending in the second direction (e.g., the Y-direction) at the first end (e.g., the upper end) of the vertical strings 207 of the individual groups. Additional individual groups of the vertical strings 207 extending in the first direction (e.g., the X-direction) and coupled to individual first select gates 208 may share a particular vertical string 207 thereof with individual group of vertical strings 207 coupled to an individual data line 214. Thus, an individual vertical string 207 of memory cells 203 may be selected at an intersection of an individual first select gate 208 and an individual data line 214. Accordingly, the first select gates 208 may be used for selecting memory cells 203 of the vertical strings 207 of memory cells 203.

The conductive structures 205 (e.g., word lines) may extend in respective horizontal planes. The conductive structures 205 may be stacked vertically, such that each conductive structure 205 is coupled to at least some of the vertical strings 207 of memory cells 203, and the vertical strings 207 of the memory cells 203 extend vertically through the stack structure including the conductive structures 205. The conductive structures 205 may be coupled to or may form control gates of the memory cells 203.

The first select gates 208 and the second select gates 210 may operate to select a vertical string 207 of the memory cells 203 interposed between data lines 214 and the source tier 216. Thus, an individual memory cell 203 may be selected and electrically coupled to a data line 214 by operation of (e.g., by selecting) the appropriate first select gate 208, second select gate 210, and conductive structure 205 that are coupled to the particular memory cell 203.

The staircase structure 220 may be configured to provide electrical connection between the access lines 218 and the conductive structures 205 through the vertical conductive contacts 211. In other words, an individual conductive structure 205 may be selected via an access line 218 in electrical communication with a respective vertical conductive contact 211 in electrical communication with the conductive structure 205. The data lines 214 may be electrically coupled to the vertical strings 207 through conductive contact structures 234.

Thus, in accordance with embodiments of the disclosure, a memory device comprises a stack structure overlying a source structure. The stack structure comprises tiers each comprising a conductive structure and an insulative structure vertically neighboring the conductive structure. The memory device comprises cell pillar structures comprising a semiconductive channel material vertically extending through the stack structure and into the source structure, a lateral contact vertically interposed between the stack structure and the source structure and in physical contact with the semiconductive channel material of the cell pillar structures, and a source contact structure horizontally neighboring the lateral contact. The source contact structure comprises a first implant region doped with one or more of boron, carbon, oxygen, nitrogen, and gallium. The memory device comprises a semiconductive cap material vertically interposed between the stack structure and the lateral contact. The semiconductive cap material comprises a second implant region doped with one or more of boron, carbon, oxygen, nitrogen, and gallium.

Figure 6:
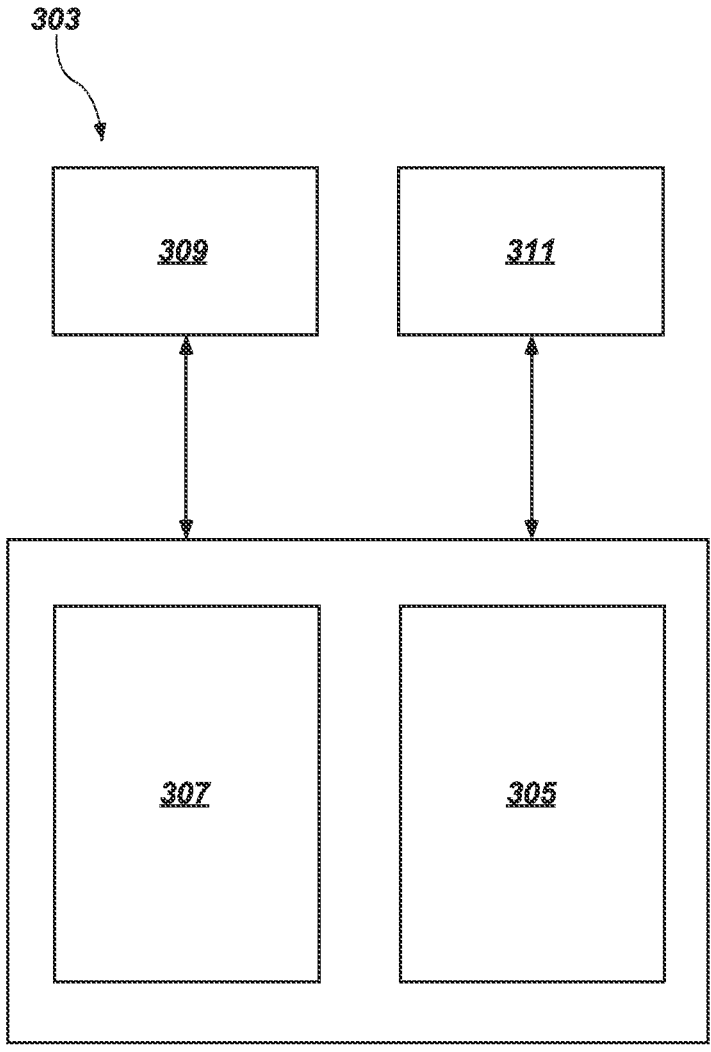
FIG. 6 is a schematic block diagram of an electronic system, in accordance with embodiments of the disclosure.

Microelectronic devices structures (e.g., the microelectronic device structure 100 (FIGS. 1A through 1D, 2J, 3C, 4A, and 4B)) and microelectronic devices (e.g., the microelectronic device 201 (FIG. 5)) in accordance with embodiments of the disclosure may be used in embodiments of electronic systems of the disclosure. For example, FIG. 6 is a block diagram of an illustrative electronic system 303 according to embodiments of disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an IPAD® or SURFACE® tablet, an electronic book, a navigation device, etc. The electronic system 303 includes at least one memory device 305. The memory device 305 may comprise, for example, one or more of a microelectronic device structure (e.g., the microelectronic device structure 100 (FIGS. 1A through 4B)) and a microelectronic device (e.g., the microelectronic device 201 (FIG. 5)) previously described herein.

The electronic system 303 may further include at least one electronic signal processor device 307 (often referred to as a "microprocessor"). The electronic signal processor device 307 may, optionally, include one or more of a microelectronic device structure (e.g., the microelectronic device structure 100 (FIGS. through 1D, 2J, 3C, 4A, and 4B)) and a microelectronic device (e.g., the microelectronic device 201 (FIG. 5)) previously described herein. While the memory device 305 and the electronic signal processor device 307 are depicted as two (2) separate devices in FIG. 6, in additional embodiments, a single (e.g., only one) memory/processor device having the functionalities of the memory device 305 and the electronic signal processor device 307 is included in the electronic system 303. In such embodiments, the memory/processor device may include one or more of a microelectronic device structure (e.g., the microelectronic device structure 100 (FIGS. 1A through 1D, 2J, 3C, 4A, and 4B)) and a microelectronic device (e.g., the microelectronic device 201 (FIG. 5)) previously described herein. The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Thus, in accordance with embodiments of the disclosures, an electronic system comprises a processor operably coupled to an input device and an output device, and one or more memory devices operably coupled to the processor. The one or more memory devices individually comprise strings of memory cells extending vertically through a tiered stack comprising a vertically alternating sequence of insulative structures and conductive structures, and slot structures vertically extending through the tiered stack and separating the tiered stack into blocks. Each of the blocks comprises some of the strings of memory cells. The individual memory devices comprise lateral contact structures horizontally neighboring and in electrical communication with the strings of memory cells, and semiconductive material vertically interposed between the tiered stack and the lateral contact structures and comprising implant regions doped with one or more of boron, carbon, oxygen, nitrogen, and gallium. The implant regions horizontally neighbor the slot structures on opposing sides thereof.

The methods, structures (e.g., the microelectronic device structure 100 (FIGS. 1A through 1D, 2J, 3C, 4A, and 4B)), devices (e.g., the microelectronic device 201 (FIG. 5)), and systems (e.g., the electronic system 303 (FIG. 6)) of the disclosure advantageously facilitate one or more of improved performance, reliability, and durability, lower costs, increased miniaturization of components, improved pattern quality, and greater packaging density as compared to conventional structures, conventional devices, and conventional systems. By way of non-limiting example, the methods and structures of the disclosure may reduce corrosion of conductive materials (e.g., semiconductive materials) during formation and removal of additional conductive materials. Additionally, the methods and structures of the disclosure may reduce the risk of undesirable deformations (e.g., tier bending, tier warping, tier bowing) and damage (e.g., tier collapse) during the formation of devices (e.g., the microelectronic device 201) of the disclosure, and may effectuate increased yield and decreased current leakage (e.g., which may otherwise result from the undesirable deformations and/or damage) as compared to conventional methods, conventional structures, and conventional devices.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
lateral contact structures overlying a source structure and comprising conductive material;
a cap material overlying the lateral contact structures and comprising:
 discrete implant regions doped with one or more of boron, carbon, oxygen, nitrogen, and gallium, the discrete implant regions respectively extending in a first horizontal direction and in a second horizontal direction substantially orthogonal to the first horizontal direction; and
 non-implanted regions substantially free of the one or more of boron, carbon, oxygen, nitrogen, and gallium, the non-implanted regions individually directly horizontally adjacent a respective one of the discrete implant regions;
a stack structure overlying the cap material and comprising a vertically alternating sequence of insulative structures and conductive structures arranged in tiers;
pillars vertically extending through the stack structure and into the source structure, the pillars individually comprising semiconductive channel material in physical contact with the lateral contact structures; and
filled slot structures vertically extending at least through the stack structure and the cap material, the filled slot structures positioned within horizontal areas of the discrete implant regions of the cap material and comprising dielectric material.

2. The microelectronic device of claim 1, further comprising a source contact structure vertically interposed between the source structure and the cap material, the source contact structure comprising additional implant regions positioned within the horizontal areas of the discrete implant regions of the cap material.

3. The microelectronic device of claim 2, wherein lateral boundaries of the discrete implant regions of the cap material are substantially coplanar with additional lateral boundaries of the additional implant regions of the source contact structure.

4. The microelectronic device of claim 1, wherein:
the microelectronic device is divided into an array region, a staircase region, and an intervening region horizontally interposed between the array region and the staircase region; and
the discrete implant regions of the cap material horizontally extend through each of the array region, the staircase region, and the intervening region.

5. The microelectronic device of claim 1, further comprising:
support structures horizontally interposed between the pillars and a staircase structure defined by horizontal ends of the tiers of the stack structure; and
a barrier region comprising an etch-resistant material horizontally interposed between the support structures and the pillars.

6. The microelectronic device of claim 1, wherein:
lower surfaces of the lateral contact structures directly contact doped semiconductive material of the source structure and one or more dielectric materials of the pillars; and
the discrete implant regions of the cap material vertically separate the lateral contact structures from a lowermost one of the conductive structures of the stack structure.

7. The microelectronic device of claim 1, wherein:

the lateral contact structures comprise conductively doped polysilicon; and the discrete implant regions of the cap material are doped with one or more of boron and carbon.

8. The microelectronic device of claim 1, wherein the discrete implant regions of the cap material directly physically contact dielectric material of the filled slot structures on at least two opposing sides, elongated portions of the implant regions of the cap material extending in the first horizontal direction in which the filled slot structures extend.

9. The microelectronic device of claim 1, wherein a width of the discrete implant regions of the cap material is relatively greater than a width of the filled slot structures in the second horizontal direction substantially orthogonal to the first horizontal direction in which the filled slot structures extend.

10. A memory device, comprising:

a stack structure overlying a source structure, the stack structure comprising tiers each comprising a conductive structure and an insulative structure vertically neighboring the conductive structure;

cell pillar structures comprising a semiconductive channel material vertically extending through the stack structure and into the source structure;

a lateral contact vertically interposed between the stack structure and the source structure and in physical contact with the semiconductive channel material of the cell pillar structures;

a source contact structure laterally abutting the lateral contact, the source contact structure comprising a first implant region doped with one or more of boron, carbon, oxygen, nitrogen, and gallium; and a semiconductive cap material vertically interposed between the stack structure and the lateral contact, the semiconductive cap material comprising a second implant region doped with one or more of boron, carbon, oxygen, nitrogen, and gallium.

11. The memory device of claim 10, wherein a material composition of the first implant region of the source contact structure is substantially the same as a material composition of the second implant region of the semiconductive cap material.

12. The memory device of claim 10, wherein each of the first implant region of the source contact structure and the second implant region of the semiconductive cap material comprises doped polycrystalline silicon.

13. The memory device of claim 10, wherein:

opposing lateral boundaries of the first implant region of the source contact structure are substantially horizontally aligned with additional opposing lateral boundaries of the second implant region of the semiconductive cap material; and the cell pillar structures are located outside of horizontal areas of the first implant region of the source contact structure and the second implant region of the semiconductive cap material.

14. An electronic system, comprising:

a processor operably coupled to an input device and an output device; and one or more memory devices operably coupled to the processor, the one or more memory devices individually comprising:

strings of memory cells extending vertically through a tiered stack comprising a vertically alternating sequence of insulative structures and conductive structures;

slot structures vertically extending through the tiered stack and separating the tiered stack into blocks, each of the blocks comprising some of the strings of memory cells;

lateral contact structures horizontally neighboring and in electrical communication with the strings of memory cells; and dielectric material vertically interposed between the tiered stack and the lateral contact structures and comprising implant regions doped with one or more of boron, carbon, oxygen, nitrogen, and gallium, the implant regions horizontally neighboring the slot structures on opposing sides thereof.

15. The electronic system of claim 14, wherein the one or more memory devices comprise 3D NAND Flash memory devices individually comprising at least one memory array and a CMOS under array (CUA) region within a horizontal area of the at least one memory array.

* * * * *